US011320508B2

(12) United States Patent
Sommer et al.

(10) Patent No.: US 11,320,508 B2
(45) Date of Patent: May 3, 2022

(54) DEEP LEARNING BASED PROCESSING OF MOTION ARTIFACTS IN MAGNETIC RESONANCE IMAGING DATA

(71) Applicant: KONINKLIJKE PHILIPS N.V., Eindhoven (NL)

(72) Inventors: Karsten Sommer, Hamburg (DE); Tom Brosch, Hamburg (DE); Tim Philipp Harder, Ahrensburg (NL); Jochen Keupp, Rosengarten (DE); Ingmar Graesslin, Boenningstedt (DE); Rafael Wiemker, Kisdorf (DE); Axel Saalbach, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/759,778

(22) PCT Filed: Oct. 22, 2018

(86) PCT No.: PCT/EP2018/078863
§ 371 (c)(1),
(2) Date: Apr. 28, 2020

(87) PCT Pub. No.: WO2019/086284
PCT Pub. Date: May 9, 2019

(65) Prior Publication Data
US 2021/0181287 A1     Jun. 17, 2021

(30) Foreign Application Priority Data
Oct. 31, 2017 (EP) ..................................... 17199301

(51) Int. Cl.
*G01R 33/565* (2006.01)
*G01R 33/56* (2006.01)
(Continued)

(52) U.S. Cl.
CPC ... *G01R 33/56509* (2013.01); *G01R 33/5608* (2013.01); *G06N 3/04* (2013.01);
(Continued)

(58) Field of Classification Search
None
See application file for complete search history.

(56) References Cited

U.S. PATENT DOCUMENTS

2011/0044524 A1*   2/2011   Wang .................... G01R 33/54
                                                                            382/131
2012/0078097 A1   3/2012   Wang et al.
(Continued)

OTHER PUBLICATIONS

Meding Kristof et al: "Automatic detection of motion artifacts in MR images using CNNS", 2017 IEEE International Conference on Acoustics, Speech and Signal Processing (ICASSP), IEEE, Mar. 5, 2017, pp. 811-815, XP033258530, DOI: 10.1109/ICASSP. 2017. 7952268.*

(Continued)

*Primary Examiner* — Jiangeng Sun

(57) ABSTRACT

The invention relates to a magnetic resonance imaging data processing system (126) for processing motion artifacts in magnetic resonance imaging data sets using a deep learning network (146, 502, 702) trained for the processing of motion artifacts in magnetic resonance imaging data sets. The magnetic resonance imaging data processing system (126) comprises a memory (134, 136) storing machine executable instructions (161, 164) and the trained deep learning network (146, 502, 702). Furthermore, the magnetic resonance imaging data processing system (126) comprises a processor (130) for controlling the magnetic resonance imaging data processing system. Execution of the machine executable instructions (161, 164) causes the processor (130) to control the magnetic resonance imaging data processing system (126) to: receive a magnetic resonance imaging data set
(Continued)

(144, 500, 800), apply the received magnetic resonance imaging data set (144, 500, 800) as an input to the trained deep learning network (146, 502, 702), process one or more motion artifacts present in the received magnetic resonance imaging data set (144, 500, 800) using the trained deep learning network (146, 502, 702).

15 Claims, 9 Drawing Sheets

(51) Int. Cl.
    *G06N 3/04*     (2006.01)
    *G06N 3/08*     (2006.01)
    *G06T 5/00*     (2006.01)
    *G06T 5/20*     (2006.01)
    *G06T 5/50*     (2006.01)
    *G06T 7/00*     (2017.01)

(52) U.S. Cl.
    CPC ............... *G06N 3/08* (2013.01); *G06T 5/001* (2013.01); *G06T 5/20* (2013.01); *G06T 5/50* (2013.01); *G06T 7/0012* (2013.01); *G06T 2207/10088* (2013.01); *G06T 2207/20081* (2013.01); *G06T 2207/20084* (2013.01); *G06T 2207/20224* (2013.01); *G06T 2207/30168* (2013.01)

(56) References Cited

U.S. PATENT DOCUMENTS

| | | | |
|---|---|---|---|
| 2013/0204122 A1* | 8/2013 | Hendler | A61B 5/369 600/411 |
| 2015/0241538 A1* | 8/2015 | Lu | G01R 33/56509 600/419 |
| 2017/0011185 A1 | 1/2017 | Schweizer | |
| 2017/0091574 A1 | 3/2017 | Udupa et al. | |
| 2017/0109881 A1 | 4/2017 | Avendi et al. | |
| 2019/0108634 A1* | 4/2019 | Zaharchuk | G06T 7/50 |

OTHER PUBLICATIONS

P. Storey, et al., "Band Artifacts Due to Bulk Motion" MRM 48:1028-1036, 2002.
M. Zaitsev, et al., "Motion Artifacts in MRI: A Complex Problem with Many Partial Solutions" JMRI 42:887-901, 2015.
HH Abujudeh, et al., "Quality Initiatives: Key Performance Indicators for Measuring and Improving Radiology Department Performance" RadioGraphics 30:571-580, 2010.
A. Krizhevsky, et al., "Image Net Classification with Deep Convolutional Neural Networks" Adv Neural Inf Process Syst, 2012.
L. Herzog, et al., "Master Thesis:Measuring Quality in Radiology" 2016.
I. Blystad, et al., "Synthetic MRI of the Brain in a Clinical Setting" Acta radiologica 53:1158-1163, 2012.
K.P. McGee, "Image Metric Based Correction of Motion Effects: Analysis of Image Metrics" Journal of Magnetic Resonance Imaging, 11:174-181, 2000.
K. Pruessmann, et al., "SENSE: Sensitivity Encodign for Fast MRI" MRM 42:952-962, 1999.
M. Markl, et al., "Time-resolved 3D MR velocity mapping at 3T: improved navigator-gated assessment of vascular anatomy and blood flow" JMRI 25:824-831, 2007.
J. Maclaren, et al., "Prospective Motion Correction in Brain Imaging" MRM 69:621-636, 2013.
D. Atkonson, et al., "Reconstruction After Rotational Motion" MRM 49:183-187, 2003.
J. Long, E. Shelhamer and T. Darrell, "Fully convolutional networks for semantic segmentation," 2015 IEEE Conference on Computer Vision and Pattern Recognition (CVPR), 2015, pp. 3431-3440, doi: 10.1109/CVPR.2015.7298965.
T. Brosch, et al. "Deep 3D Convolutional Encoder Networks With Shortcuts for Multiscale Feature Integration Applied to Multiple Sclerosis Lesion Segmentation" IEEE Medical Imaging, 35:5, 1229-1239, 2016.
Fang Liu et al Deep Convolutional Neural Network and 3D Deformable Approach for Tissue Segmentation in Musculoskeletal Magnetic Resonance Imaging; ,Magnetic Reson. In Med. 2017.
Medink Kristof et al. "Automatic Detection of Motion Artifacts in MR Images Using CNNS" 2017 IEEE International Conf. on Acoustics Speech and Signal Processing, Mar. 5, 2017 p. 811-815.
Küstner Thomas et al: "Automated reference-free detection of motion artifacts in magnetic resonance images", Magnetic Resonance Materials in Physics,Biology and Medicine, Springer, DE, GB, vol. 31, No. 2,Sep. 20, 2017 (Sep. 20, 2017), pp. 243-256.
Chiang Sylvester et al: "Motion Corruption Detection in Breast DCE-MRI",Sep. 7, 2017 (Sep. 7, 2017), ECCV 2016 Conference; [Lecture Notes in Computer Science; Lect.Notes Computer], Springer International Publishing, Cham, pp. 10-18.
Benedikt Lorch et al: "Automated Detection of Motion Artefacts in MR Imaging Using Decision Forests", Journal of Medical Engineering,vol. 2017, Jun. 11, 2017 (Jun. 11, 2017),pp. 1-9.
International Search Report and Written Opinion from PCT/EP2018/078863 dated Nov. 15, 2018.

* cited by examiner

DEEP LEARNING BASED PROCESSING OF MOTION ARTIFACTS IN MAGNETIC RESONANCE IMAGING DATA

CROSS REFERENCE TO RELATED APPLICATIONS

This application is a U.S. national phase application of International Application No. PCT/EP2018/078863 filed on Oct. 22, 2018, which claims the benefit of EP Application Serial No. 17199301.7 filed on Oct. 31, 2017 and is incorporated herein by reference.

FIELD OF THE INVENTION

The invention relates to processing motion artifacts in magnetic resonance imaging data, in particular it relates to methods and apparatuses for processing motion artifacts in magnetic resonance imaging data using deep learning.

BACKGROUND OF THE INVENTION

Due to typically long data acquisition times of magnetic resonance imaging (MRI) procedures, motion artifacts caused by patient motion are one of the most frequent causes of image degradation of magnetic resonance images in clinical applications of MRI. Despite the severity of the problems associated with such image degradations, detection of these artifacts usually requires manual assessment by an experienced radiologist. Possible problems associated with motion artifacts may for example comprise that the respective magnetic resonance images may be of little or even no use for medical diagnosis due to the image degradation. This may also complicate the clinical workflow, e.g. if a radiologic technologist is unable to detect the presence of motion artifacts in the acquired magnetic resonance images. In addition, image degradations may result in a reduced patient throughput. A manual assessment by an experienced radiologist may be time consuming. Monitoring the overall quality of acquired magnetic resonance images as part of a performance assessment of a clinical magnetic resonance imaging department may create considerable additional workload for the radiologist. Furthermore, a degraded magnetic resonance image may require a complete repetition of the magnetic resonance imaging procedure.

Furthermore, assessment and improvement of the quality of care in imaging departments is rapidly gaining attention in recent years. The employed key performance indicators (KPIs) often measure quantities such as patient throughput or equipment utilization. Recently, image quality has received more and more attention as an additional KPI.

Several methods for preventing motion artifacts exist, but these are generally limited to particular imaging situations. Consequently, motion artifacts are still commonplace in clinical MRI, and regularly lead to images that are unusable for medical diagnosis.

SUMMARY OF THE INVENTION

The invention provides for a magnetic resonance imaging data processing system, a method of operating the magnetic resonance imaging data processing system, and a computer program product in the independent claims. The invention further provides a magnetic resonance imaging system comprising the magnetic resonance imaging data processing system. Embodiments are given in the dependent claims.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object-oriented programming language such as Java, Smalltalk, C++ or the like and conventional procedural programming languages, such as the "C" programming language or similar programming languages and compiled into machine executable instructions. In some instances, the computer executable code may be in the form of a high-level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks. A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance Imaging (MRI) data, also referred to as Magnetic Resonance (MR) data, is defined herein as being the recorded measurements of radio frequency signals emitted by nuclear spins using the antenna of a magnetic resonance apparatus during a magnetic resonance imaging scan. Magnetic resonance imaging data is an example of medical image data. A Magnetic Resonance Imaging (MRI) image or MR image is defined herein as being the reconstructed two or three-dimensional visualization of anatomic data comprised by the magnetic resonance imaging data, i.e. MRI images are provided by MRI data sets comprising a representative selection MRI data. This visualization can be performed using a computer. Magnetic resonance imaging data may be provided using a representation of the respective data in k-space or image space. Using a Fourier transformation, the magnetic resonance imaging data may be transformed from k-space to image space or vice versa. In the following, a magnetic resonance imaging data set may comprise MRI data in k-space or image space. In particular, magnetic resonance imaging data set may comprise a selection of MRI data in image space representative of a two or three-dimensional anatomic structure, i.e. a MRI image.

A 'deep learning network' as used herein encompasses networks for machine learning, like e.g. neural networks, with multiple hidden layers between an input and an output layer. Deep learning refers to a class of machine learning methods which use a cascade of multiple layers of nonlinear processing units for. Each successive layer uses the output from the previous layer as input. Deep learning may be performed supervised and/or unsupervised. Furthermore, deep learning may use some form of gradient descent for training via backpropagation.

'Neural networks' as used herein encompasses are computing systems configured to learn, i.e. progressively improve their ability, to do tasks by considering examples, generally without task-specific programming. A neural network comprises a plurality of units referred to as neurons which are communicatively connected by connections for transmitting signals between connected neurons. The connections between neurons are referred to as synapses. Neurons receive a signal as input, change their internal state, i.e. the activation, according to the input. Depending on the input, the learned weights and bias an activation is generated as output and sent via one or more synapses to one or more connected neurons. The network forms a directed and weighted graph, where the neurons are the nodes and the connection between the neurons are weighted directed edges. The weights and biases may be modified by a process called learning, which is governed by a learning rule. The learning rule is an algorithm which modifies the parameters of the neural network, in order for a given input to the network to produce a favored output. This learning process may amount to modifying the weights and biases of the network.

The neurons are organized in layers. Different layers may perform different types of transformations on their inputs. Signals applied to a neuronal network travel from a first layer, i.e. the input layer, to the last layer, i.e. output layer, traversing hidden layers arranged between input and output layer.

'Network parameters' as used herein encompass weights and biases of the neurons which may be varied as learning proceeds and which may increase or decrease the strength of signals that are sends downstream by the neurons via the synapses.

A 'deep convolutional neural network' as used herein encompasses a deep, feed-forward neural network comprising a plurality of convolutional layers with one or more fully connected layers on top. Furthermore, a deep convolutional neural network' may comprises pooling layers, e.g. max-pooling layers or average-pooling layer. Convolutional layers apply a convolution operation to the input, passing the result to the next layer. Furthermore, convolutional layers share weights, i.e. all weights of a convolutional layer are identical. Pooling layers merge the outputs of neuron clusters at one layer into an input to a single neuron in the next layer. For example, max pooling layers use for each neuron cluster a maximum value of the outputs as input for the next layer. Another example are average pooling layers, which use an average value of the outputs as input for the next layer. Fully connected layers connect every neuron in one layer to every neuron in another layer. A deep convolutional neural network may comprise further layer types, like e.g. rectified-linear unit layers (ReLU layers), batch normalization layers (BN-layers), dropout layer etc.

A 'fully convolutional neural network' as used herein encompasses a convolutional neural network comprising no fully connected layers. In contrast to a convolutional network, a fully convolutional neural network may exhibit a symmetric structure, where the fully connected layers are replaced by un-pooling and/or de-convolutional layers including skip connections between high resolution layers. While a deep convolutional neural network computes a general nonlinear function, a fully convolutional neural network with only layers of the aforementioned form computes a nonlinear filter. Fully convolutional networks may comprise in addition to convolutional layers and pooling layers un-pooling layers and/or de-convolutional layers and/or further layer types, like e.g. rectified-linear unit layers (ReLU layers), batch normalization layers (BN-layers), dropout layer etc.

In one aspect, the invention relates to a magnetic resonance imaging data processing system for processing motion artifacts in magnetic resonance imaging data sets using a deep learning network trained for the processing of motion artifacts in magnetic resonance imaging data sets. The magnetic resonance imaging data processing system comprises a memory storing machine executable instructions as well as the trained deep learning network. Furthermore, the magnetic resonance imaging data processing system comprises a processor for controlling the magnetic resonance imaging data processing system. An execution of the machine executable instructions causes the processor to control the magnetic resonance imaging data processing system to receive a magnetic resonance imaging data set. The magnetic resonance imaging data processing system applies the received magnetic resonance imaging data set as an input to the trained deep learning network and processes one or more motion artifacts present in the received magnetic resonance imaging data set using the trained deep learning network.

The processing may e.g. comprise detecting that the one or more motion artifacts are present in the received magnetic resonance imaging data set, determining a motion artifact level based on the one or more motion artifacts present in the received magnetic resonance imaging data set, wherein the motion artifact level characterizing the number and/or degree of the respective motion artifacts, and/or filtering the one or more motion artifacts present in the magnetic resonance imaging data set. A filtering of one or more motion artifacts present a magnetic resonance imaging data set may for example result in a version of the magnetic resonance imaging data set without the one or more motion artifacts, i.e. a motion-artifact-corrected magnetic resonance imaging data set, or in a motion-artifact-only magnetic resonance imaging data set comprising only the one or more motion artifacts. A motion-artifact-corrected magnetic resonance imaging data set refers to a magnetic resonance imaging data set in which motion artifacts have been minimized.

The magnetic resonance imaging data comprised by the magnetic resonance imaging data set which is applied to the trained deep learning network may be provided in k-space or image space representation.

Image degradation of magnetic resonance images due to subject motion during the acquisition of magnetic resonance data is one of the most persistent problems in the clinical application of magnetic resonance imaging. The associated motion artifacts may e.g. appear as ghosting or blurring in the images and often reduce image quality to a degree that makes medical analysis impossible.

Due to lack of methods for automatic motion artifact detection, the evaluation of magnetic resonance images currently relies on manual labeling of artifact level by an experienced radiologist. However, such an approach generates considerable additional workload and may strongly depend on the experience of individual person evaluating the images.

In a clinical setting, correct detection and identification of motion artifacts may not be straightforward. Due to high demands in terms of patient throughput, radiologic technologists controlling magnetic resonance imaging systems may be subject to high time pressure and may not be trained to recognize motion-related artifacts. Consequently, the cause of the artifact may not be immediately identified, rendering the resulting images inadequate for diagnosis, potentially even requiring a re-scheduling of the entire magnetic resonance imaging session in order generate new adequate magnetic resonance data.

Furthermore, due to a lack of methods for automatic retrospective motion artifact correction, image degradation of magnetic resonance images due to motion artifacts can currently not be corrected, once the magnetic resonance data is acquired.

Embodiments may have the beneficial effect of providing an automatic processing of motion-related artifacts in magnetic resonance images using deep learning implemented by a deep learning network. The deep learning network may e.g. be implemented in form of a deep convolution neural network or a fully convolutional network. Embodiments may facilitate a robust and reliable processing of motion artifacts. Processing of motion artifacts may further enable determining the impact of the same on the image quality without requiring any user interaction. Furthermore, e.g. in case of a filtering of the motion artifacts, their impact on the image quality may be minimized, i.e. reduced or even canceled. Embodiments may for example be implemented for a fast processing of magnetic resonance imaging data sets directly after data acquisition, e.g. as part of a magnetic resonance imaging system, or as part of a post-processing of stored magnetic resonance imaging data sets e.g. in the course of a performance assessment, an image quality assessment and/or image quality optimization.

Embodiments facilitate automatic detection of motion-related artifacts in magnetic resonance imaging data sets and, e.g. based on the application of a tailored deep convolutional neural network, determination of an artifact level without requiring any user input. Embodiments may furthermore allow for an automatic retrospective motion artifact correction in magnetic resonance images without requiring any user input.

According to embodiments, the deep learning network is further trained for detecting the presence of motion artifacts in magnetic resonance imaging data sets. The processing comprises detecting the presence of the one or more motion artifacts in the received magnetic resonance imaging data set. The execution of the machine executable instructions further causes the processor to control the magnetic resonance imaging data processing system to indicate the presence of the one or more motion artifacts in the received magnetic resonance imaging data set. Embodiments may have the beneficial effect that using the trained deep learning network, e.g. in form of a deep convolutional neural network, an effective automatic notification system for motion artifacts may be implemented. In case a motion artifact is present in a magnetic resonance imaging data set processed, the user may be notified by indicating the present of motion artifacts and enabled to take adequate measure and/or conclusions based on the respective notification. For example, magnetic resonance data acquisition may be repeated, the patient may be instructed in order to avoid further motion artifacts and/or the more attention may be paid to motion artifacts, when assessing the magnetic resonance imaging data sets.

According to embodiments, the deep learning network is further trained for determining a motion artifact level of magnetic resonance imaging data sets. The motion artifact level characterizes the number and/or degree of motion artifacts present in the respective magnetic resonance imaging data set. The processing further comprises determining the motion artifact level of the received magnetic resonance imaging data set based on the one or more motion artifacts detected to be present in the received magnetic resonance imaging data set using the trained deep learning network. Furthermore, the motion artifact level is provided as output from the trained deep learning network. The indicating of the presence of the one or more motion artifacts comprises assigning a motion artifact level identifier to the received magnetic resonance imaging data set identifying the determined motion artifact level.

Embodiments may have the beneficial effect that an effective automatic determination of a motion artifact level of a magnetic resonance imaging data sets is provided. The motion artifact level may range from motion-artifact-free, rendering the imaging data sets, more particular MRI images, well suited for diagnosis, to heavily motion-artifact-corrupted, rendering the respective images inadequate for diagnosis. From the motion artifact level identifier, the motion artifact level of the received magnetic resonance imaging data set may easily be derivable. The motion artifact level identifier may for example be provided in form of a quantitative label describing the level of motion artifacts present in the magnetic resonance imaging training data set.

According to embodiments, the determining of the motion artifact level comprises classifying the motion artifact level. The trained deep learning network may classify the motion artifact level, i.e. determine to which class of a set of classes (categories) the received magnetic resonance imaging data set belongs. Such a classification may be considered as a specific type of pattern recognition. Classification is an instance of supervised learning. The motion artifact level may be provided in form of a discrete motion artifact level identifier, like e.g. a categorical (e.g. "A", "B", "C", . . . ), ordinal (e.g. "low", "medium", "high", . . . ) or integer-valued ("0", "1", "2", . . . ) quantity identifying the determined motion artifact level.

According to embodiments, the motion artifact level may be provided in form of a continuous motion artifact level identifier, like e.g. a real-valued quantity. This real-valued motion artifact level identifier may e.g. be calculated using regression.

Thus, in case of a motion artifact level determination, the trained deep learning network may receive the magnetic resonance imaging data set as input and return a single quantity, i.e. the motion artifact level, as output.

According to embodiments, the deep learning network is a deep convolutional neural network implementing deep learning. Embodiments may have the beneficial effect that a deep convolutional neural network may be well suited for determining and assigning motion artifact levels to magnetic resonance imaging data sets.

According to embodiments, the deep learning network is further trained for filtering motion artifacts present in magnetic resonance imaging data sets. The processing further comprises filtering the one or more motion artifacts present in the magnetic resonance imaging data set using the trained deep learning network and providing a motion-artifact-corrected magnetic resonance imaging data set using a result of the filtering. A motion-artifact-corrected magnetic resonance imaging data set refers to a magnetic resonance imaging data set with a reduced magnetic resonance level, i.e. degree of imaging data set degradation, compared to an input magnetic resonance imaging data set with motion artifacts.

Embodiments may have the beneficial effect that a correction of motion artifacts may not only be enabled during data acquisition by avoiding the appearance of motion artifacts, but also afterwards, i.e. in retrospect e.g. during post-processing of the magnetic resonance imaging data sets.

A large number of methods has been developed to avoid the appearance of motion artifacts in magnetic resonance images, such as faster imaging techniques, motion correction using either navigators or external tracking devices. Motion correction can be performed either prospectively, i.e. by adjusting the scan parameters during the scan, or retrospectively, i.e. by modifying the collected data. However, known approaches for motion artifact reduction may either complicate the clinical workflow, such as methods that involve mounting a tracking device on the subject, or may only be applicable to particular imaging situations, such as navigator-based approaches that require additional scan time.

Embodiments may overcome these problems by adopting a deep-learning-based approach to correct for motion artifacts in MRI data sets and in particular in MRI images. After successful training, the deep learning network may allow for retrospective correction of artifacts in acquired MRI data without relying on knowledge of the precise motion trajectory. For example, a fully convolutional neural network may be employed for imaging data set filtering relying on a two-phase procedure. In a first phase, a large artificial training set may be generated using motion-artifact-free MRI reference data sets. In a second phase, the fully convolutional neural network is trained for motion artifact correction, while the final trained fully convolutional neural network may be applied as an imaging data set filter to actual motion-artifact-corrupted magnetic resonance imaging data sets in order to generate imaging data sets with a substantially reduced motion artifact level.

According to embodiments, the result of the filtering comprises the motion-artifact-corrected magnetic resonance imaging data set which is provided as output from the deep learning network. Thus, the received magnetic resonance imaging data set may be provided as input to the deep learning network and a motion-artifact-corrected magnetic resonance imaging data set may be returned as output from the deep learning network. Embodiments may have the beneficial effect that the motion-artifact-corrected magnetic resonance imaging data set may directly be provided by the deep learning network.

According to embodiments, the result of the filtering comprises a motion-artifact-only magnetic resonance imaging data set provided as output from the deep learning network and the providing of the motion-artifact-corrected magnetic resonance imaging data set comprises subtracting the motion-artifact-only magnetic resonance imaging data set from the received magnetic resonance imaging data set. Thus, the received magnetic resonance imaging data set may be provided as input to the deep learning network and a motion-artifact-only magnetic resonance imaging data set may be returned as output from the deep learning network. In order to generate a motion-artifact-corrected magnetic resonance imaging data set, the motion-artifact-only magnetic resonance imaging data set may be subtracted from the received magnetic resonance imaging data set, i.e. the imaging data set structures identified as resulting from motion artifacts are subtracted such that only motion-artifact-free imaging data sets structures remain.

Embodiments may have the beneficial effect that it may be easier for a deep learning network to be trained to identify imaging data set structures due to motion artifacts and provide the same as a motion-artifact-only magnetic resonance imaging data set than to identify all the all other imaging data set structures comprised by magnetic resonance imaging data set and provide the same as a motion-artifact-corrected magnetic resonance imaging data set. Embodiments may thus have the beneficial effect of enabling a more precise motion artifact correction based on a more precise identification of motion artifacts. Furthermore, the motion-artifact-only magnetic resonance image may be provided in addition in order to provide additional insight in the motion artifacts present in the received magnetic resonance imaging data set. For example, the positions of the corrected motion artifacts may be provided. Furthermore, inside in the image structures removed from the received magnetic resonance image is enabled.

According to embodiments, the position of the filtered one or more artifacts is indicated in the motion-artifact-corrected magnetic resonance image provided by the motion-artifact-corrected magnetic resonance imaging data set.

According to embodiments, the deep learning network is a fully convolutional neural network. The fully convolutional neural network may comprise a symmetric structure. It may e.g. comprise de-convoluting layers and/or un-pooling layers.

Embodiments may have the beneficial effect that fully convolutional neural network may provide an effective filter for correction of motion artifacts, in particular for retrospective corrections.

Unlike convolutional neural networks for classification, convolutional neural network, i.e. with de-convoluting and un-pooling layers replacing the fully connected layers of a convolutional neural networks for classification, may allow for an efficient generation of predictions at pixel level. These networks may be applied as motion artifact filters for reducing the motion artifact level of magnetic resonance imaging data sets.

According to embodiments, the proposed filtering concept may be adapted to alternative data sources and/or additional input. Embodiments may e.g. make use of complex k-space data which is obtained during the acquisition of magnetic resonance data during a magnetic resonance scan. Embodiments may further use complex data of individual receive coil elements of a magnetic resonance imaging system to exploit inherent redundancy in multi-channel data.

A fully convolutional neural network may be applied for magnetic resonance imaging data set correction on a scanner console of a magnetic resonance imaging system directly after data acquisition, when the complex raw data is still available. Alternatively, the fully convolutional neural network may be employed to retrospectively reduce motion artifacts in a magnetic resonance images comprised by image archives or in a diagnostic workstation.

According to embodiments, the execution of the machine executable instructions further causes the processor to control the magnetic resonance imaging data processing system to train a deep learning network in order to provide the trained deep learning network. The training comprises providing a training set comprising a plurality of magnetic resonance imaging training data sets with and without motion artifacts.

Embodiments may have the beneficial effect that using magnetic resonance imaging training data sets with different motion artifacts levels an efficient and effective training of the deep learning network may be ensured. Magnetic resonance imaging training data sets may e.g. be clinical imaging data sets with and without motion artifacts or artificially generated imaging data sets based on motion-artifact-free clinical imaging data sets to which artificially motion artifacts have been introduced.

For example, during a training stage, a labeled dataset may be used to train the deep learning network. During an application stage, the trained deep learning network is then applied to detect and classify motion artifacts in clinical magnetic resonance imaging data sets, like e.g. a clinical MRI image.

According to embodiments, the providing of the training set comprises generating the magnetic resonance imaging training data sets with motion artifacts. The generating of the magnetic resonance imaging training data sets comprises introducing varying numbers, degrees and/or types of artificially generated motion artifacts to magnetic resonance imaging data sets without motion artifacts.

Embodiments may have the beneficial effect of providing an implementation of an automated generation of training set comprising a large number of magnetic resonance imaging training data sets with varying levels of motion artifacts. Such magnetic resonance imaging training data sets may e.g. be used for data augmentation purposes. Training of the deep learning network may thus be realized based on an automated generation of a large artificially generated datasets. Thereby, the need for large quantities of labeled input imaging data sets may be avoided.

According to embodiments, trajectories of gross patient motion or physiological motion, in particular variants of translational or rotational motion trajectories, are selected from a group comprising e.g. discontinuous motion (e.g. "jumps", "jerks", "swallowing"), oscillating motion (e.g. "respiration"), and continuous motion (e.g. "bowel peristaltic motion", "head sinking into the cushion") simulated with varying motion amplitudes. Embodiments may have the beneficial effect that any type of motion can be prospectively simulated without having actual examples of MR data available that are actually corrupted by this motion type.

According to embodiments, the generation of magnetic resonance imaging training data sets with motion artifacts may comprise introducing a phase shift in k-space to one or more sections of magnetic resonance data of one or more of the motion-artifact-free magnetic resonance imaging data sets or direct translations of (sub-)portions of the image in image space. If processed in k-space, subsequently, the magnetic resonance imaging data including the motion simulation (e.g. phase shift) can be either directly stored as k-space training data or may additionally be transformed back from k-space to image space. For motion simulation in image space, again, image space and/or transformed k-space data can be stored for training purposes. Embodiments may have the beneficial effect that a large number of training data sets (k-space or image space data) is efficiently provided based on artificially generated motion artifacts. This extensive simulated magnetic resonance data is advantageously used to train the deep learning network.

Since extensive training datasets with labeled training images are often not available from the relevant application areas (e.g. hospitals), a method is described in the following that facilitates an artificial creation of a suitable training set (as described above) in combination with an automatic generation of the corresponding labels. Thus, a quantitative label for the level of motion artifacts contained in a current training data set is provided. Starting from the Fourier shift theorem, a displacement $\vec{T}$ of the object in image space corresponds to a linear phase shift $\varphi$ in k-space, $$S_m(\vec{k}) = S_s(\vec{k})e^{i\varphi} = S_s(\vec{k})e^{i2\pi \vec{k}\cdot\vec{T}},$$

where $S_m$ and $S_s$ are the images with and without displacement, respectively.

Any translational motion may thus be described by a parametrization of the vector $\vec{T}$. As an example, a shift of the object in y-direction may be simulated by introducing the following phase shift to the original data:

$$\varphi = 2\pi \cdot \vec{k} \cdot \vec{T} = 2\pi \cdot \delta k \cdot j \cdot n_s \cdot \Delta y = 2\pi \cdot j \cdot \frac{n_s}{N},$$

where $\delta k = 1/(N \cdot \Delta y)$ is an increment between adjacent phase encoding (PE) lines, j is a PE line index, $n_s$ is a displacement in numbers of pixels, and $\Delta y$ is a voxel size in PE direction. If the phase shift according to the equation above is applied to all PE lines, the entire object will be displaced in image space without any motion artifact. On the other hand, an abrupt patient motion during the scan may for example be simulated by applying the phase shift according to the equation above only to a subset of all k-space lines. In this case, it is assumed that the motion is happening as a point event m at some stage of the image acquisition. In case of a sequential k-space ordering, all lines with $j > j_m$ may have to be adjusted, where $j_m$ defines the PE line where the motion event m occurred. In case of other k-space ordering schemes, like e.g. center-out, interleaved, etc., the selection of PE lines where the phase shift is applied, has to be modified accordingly.

This approach for the simulation of magnetic resonance image motion artifacts involves the selection of several parameters that define the specific appearance of the artifacts: $n_s$, $j_m$, $\alpha$, as well as the properties of the k-space ordering scheme. The described approach therefore allows for a fast generation of large artificial training sets by varying these parameters, which determine the type of motion artifact to be expected in the magnetic resonance images. Since the characteristics of the generated artifacts are known, generation of a list of motion-artifact-defining labels, i.e. motion artifact level identifiers, may be straightforward.

Once the deep learning network has been trained to allow for the detection of motion-related artifacts and/or determination of motion artifact level, it can may applied to actual clinical data for a detection of motion artifacts. According to embodiments, the output of the deep learning network may correspond to the labels that were employed during the training stage. In case of a pure detection of presence approach, the deep learning network may categorize input imaging data sets in terms of "artifact-free" and "artifact comprising". In case of a more complex classification approach, the deep learning network may categorize input imaging data sets in terms of classes of motion artifact level, such as e.g. "no artifact", "mild artifact", and "severe artifact". Alternatively, a regression algorithm instead of a classification algorithm may be employed yielding floating-point numbers that represent an estimate of the deep learning network regarding the individual motion artifact levels of the imaging data sets.

A rotational motion during a magnetic resonance imaging scan may be simulated in a way similar to the simulation of a translational motion. In this case, an appropriate transformation is applied to the object in image space. The transformation may be defined by the rotational angle α. Then, the k-space data of the original and the k-space data of the transformed images are combined. Again, the assumed k-space ordering scheme has to be taken into account for the selection of the PE lines for the combined images. An inverse Fourier transform applied to the combined images in k-space may yield an image with artificial motion artifacts due to rotational motion. Again, combined k-space data and/or transformed image space data may be stored for deep learning network training purposes.

According to embodiments, the magnetic resonance imaging training data sets are each assigned with a quantitative label describing the level of (simulated) motion artifacts which identifies the motion artifact level of the respective magnetic resonance imaging training data which is obtained as result of motion artifact simulation. According to embodiments, the motion artifact levels are determined depending on the values of the parameters used for generating the artificial motion artifacts.

According to embodiments, the determination of the motion artifact level of a magnetic resonance imaging training data set may comprise comparing the magnetic resonance imaging training data set with the motion-artifact-free magnetic resonance imaging data sets used for generating the respective magnetic resonance imaging training data set. The motion artifact level may be determined depending on the degree of similarity between the imaging data sets compared. For example, the structural similarity (SSIM) index used for measuring the similarity between the two imaging data sets. The structural similarity (SSIM) index may provide an efficient automatic method for predicting the perceived quality of digital imaging data sets and thus to determine differences of the perceived quality between different imaging data sets. Embodiments may have the beneficial effect that a fully automated approach for providing a large set of magnetic resonance imaging training data set labeled with motion artifact levels is provided.

According to embodiments, the magnetic resonance imaging data sets without motion artifacts are provided using a plurality of sets of magnetic resonance data without motion artifacts and from each set of magnetic resonance data a plurality of copies of magnetic resonance imaging data sets without motion artifacts are generated, each copy comprising a differently weighted magnetic resonance contrast. Embodiments may have the beneficial effect that an efficient approach for providing a large number of magnetic resonance imaging training data sets for training the deep learning network, e.g. in form of a fully convolutional network, as a filter for reducing the amount motion artifacts comprised by a magnetic resonance imaging data set may be implemented.

Thus, the generation of synthetic imaging data sets based on quantitative magnetic resonance techniques may be employed to create magnetic resonance imaging data sets with additional contrasts. This approach may be used to extend the training to different magnetic resonance contrasts and to increase the size of the training set. To extend the proposed filtering mechanism to other magnetic resonance contrasts and to avoid limitation to a specific imaging protocol, the generation of synthetic magnetic resonance imaging data sets may contain contrast variations. Based on scans with quantitative measurements, e.g. for one or more of the following group: T1, T2, M0 (proton density), the appearance of anatomy with different protocol settings may be emulated.

According to embodiments, each of the magnetic resonance imaging training data sets is assigned with a motion artifact indicator. The motion artifact indicators indicate for each of the magnetic resonance imaging training data sets whether the respective magnetic resonance imaging training data set comprises a motion artifact. The training comprises training the deep learning network for detecting the presence of motion artifacts magnetic resonance imaging data sets. The magnetic resonance imaging training data sets are applied as input to the deep learning network. For each of the magnetic resonance imaging training data sets it is determined whether motion artifacts are present in the respective magnetic resonance imaging training data set using the trained deep learning network. A motion artifact indicator whether motion artifacts are present in the magnetic resonance imaging training data sets are provided as output from the deep learning network. The output of the deep learning network is compared with the motion artifact indicators assigned to the input to the deep learning network. Network parameters of the deep learning network are adapted in order to reduce differences between the output of the deep learning network and the motion artifact indicators assigned to the input to the deep learning network. Embodiments may have the beneficial effect that an effective and efficient way of training a deep learning network for detecting the presence of motion artifacts in magnetic resonance imaging data sets is provided.

According to embodiments, each of the magnetic resonance imaging training data sets is assigned with a motion artifact level identifier. The training comprises training the deep learning network for determining motion artifact levels of magnetic resonance imaging data sets. The magnetic resonance imaging training data sets are applied as input to the deep learning network. For each of the magnetic resonance imaging training data sets a motion artifact level of the respective magnetic resonance imaging training data set is determined using the trained deep learning network. The motion artifact levels of the magnetic resonance imaging training data sets are provided as output from the deep learning network. The output of the deep learning network is compared with the motion artifact levels identified by the motion artifact level identifiers assigned to the input to the deep learning network. Network parameters of the deep learning network are adapted in order to reduce differences between the output of the deep learning network and the motion artifact levels identified by the motion artifact level identifiers assigned to the input to the deep learning network. Embodiments may have the beneficial effect that an effective and efficient way of training a deep learning network for determining the motion artifact level of magnetic resonance imaging data sets is provided.

According to embodiments, the training set further comprises for each of the magnetic resonance imaging training data sets a magnetic resonance imaging reference data set assigned to the respective magnetic resonance imaging training data set. The magnetic resonance imaging reference data set is a motion-artifact-free version of the magnetic resonance imaging training data set to which it is assigned. The training comprises training the deep learning network for filtering motion artifacts present in magnetic resonance imaging data sets. The magnetic resonance imaging training data sets are applied as input to the deep learning network. Motion artifacts of the magnetic resonance imaging training data sets are filtered using the trained deep learning network. For each of the magnetic resonance imaging training data sets a motion-artifact-corrected magnetic resonance imaging data set is provided using a result of the filtering. The motion-artifact-corrected magnetic resonance imaging data sets are compared with the magnetic resonance imaging reference data sets and network parameters of the deep learning network are adapted in order to reduce differences between motion-artifact-corrected magnetic resonance imaging data sets and the magnetic resonance imaging reference data sets. Embodiments may have the beneficial effect that an effective and efficient way of training a deep learning network for filtering motion artifacts present in magnetic resonance imaging data sets is provided.

Using a training set as described above comprising pairs of magnetic resonance imaging training data sets and assigned magnetic resonance imaging reference data sets and using a suitable objective function, like e.g. the difference between the output of the fully convolutional neural network and the magnetic resonance imaging reference data sets of the training pair without motion artifacts, weights of the fully convolutional neural network may be optimized using suitable techniques such as stochastic gradient descent.

According to embodiments, the result of the filtering comprises the motion-artifact-corrected magnetic resonance imaging data sets which are provided as output from the deep learning network. Embodiments may have the beneficial effect that an effective and efficient way of training a deep learning network for generating motion-artifact-corrected magnetic resonance imaging data sets is provided.

According to embodiments, the result of the filtering comprises motion-artifact-only magnetic resonance imaging data sets provided as output from the deep learning network and the providing of the motion-artifact-corrected magnetic resonance imaging data sets comprises subtracting the motion-artifact-only magnetic resonance imaging data sets from the magnetic resonance imaging training data sets. Embodiments may have the beneficial effect that an effective and efficient way of training a deep learning network for motion-artifact-only magnetic resonance imaging data sets is provided.

According to embodiments, the magnetic resonance imaging training data sets are applied in batches to the deep learning network. According to embodiments, the comparison between the output resulting from applying the batches and the intended output for which the deep learning network is trained, i.e. the correct motion artifact indicators, motion artifact levels, motion-artifact-corrected magnetic resonance imaging data sets, motion-artifact-only magnetic resonance imaging data sets etc., is perform in statistically using statistics of the batch.

According to embodiments, the network parameters may be adapted using techniques like e.g. backpropagation. Backpropagation is used to calculate the error contribution of each neuron of the network after a batch of data, i.e. magnetic resonance imaging training data sets, is processed. This may be used by an enveloping optimization algorithm to adjust the weight of each neuron.

Thus, a tailored multi-resolution deep learning network, e.g. deep convolutional neural network or fully connected neural network, may be implemented for motion artifact detection, motion artifact level determination or retrospective motion artifact correction. In order to construct such a tailored multi-resolution deep learning network, a deep learning network may be trained using a large training dataset with artificially created motion artifacts introduced e.g. onto in vivo, clinical brain scans. For example, for brain imaging the motion simulation may comprise translations and rotations of a patient's head at various time steps and with different intensity.

According to embodiments, the network parameters of the deep learning network are adapted using an iterative adjustment. The iterative adjustment comprises a plurality of cycles of iteration. Each cycle of iteration comprises determining differences between the resulting output of the deep learning network and the intended output for which the deep learning network is trained. According to embodiments, the iterative adjustment is terminated, if the number cycles of iteration reaches a predefined first threshold or if the differences between the resulting output of the deep learning network and the intended output reach a predefined second threshold. For determine the differences statistics over batches may be used. Additional, the performance on separate test or validation dataset can be monitored in order to avoid overfitting.

According to embodiments, pre-training strategies may be considered in order to avoid the need for large labeled magnetic resonance datasets for training purposes. Existing deep learning networks, which are not trained for processing motion artifact in magnetic resonance imaging data sets, may be used as generic feature extractors, while certain layers may be replaced and/or fine-tuned for the specific application, i.e. processing motion artifact in magnetic resonance imaging data sets.

According to embodiments, in addition to features that are extracted by the deep learning network, traditional features for motion artifact estimation, like e.g. motion artifact presence detection or artifact level determination, may be employed in addition. For example, gradient based features may be used as additional input, e.g. for the fully connected layers in case of a deep convolutional network.

Furthermore, strategies for a re-training on the deep learning network may be taken into account. Based on a user feedback, e.g. a rating of the imaging data sets by a radiologic technologist or radiologist, a re-training of the deep learning network may be triggered in order to adapt the deep learning network to local guidelines and preferences as well as to train the deep learning network to detect additional types of artifacts.

According to embodiments, the deep learning network is configured and trained to return a motion-artifact-corrected magnetic resonance imaging data set. The deep learning network is e.g. implemented as a fully convolutional network. Embodiments may have the beneficial effect of enabling a retrospective correction of motion artifacts. According to embodiments, the deep learning network is configured and trained to return a motion-artifact-only magnetic resonance image, which may be employed for the correction of an original motion-artifact-corrupted image or for a visual highlighting of motion artifacts in the original motion-artifact-corrupted.

According to embodiments, receiving the magnetic resonance imaging data set comprises: sending a request for the respective magnetic resonance imaging data set to a magnetic resonance imaging data set database, wherein in response to the request the requested magnetic resonance imaging data set is received from the magnetic resonance imaging data set database. Embodiments may have the beneficial effect that magnetic resonance imaging data sets stored in a database may retrospectively be evaluated.

This may for example be combined with a dedicated reporting solution that realizes automatic data extraction from the magnetic resonance imaging data set database provided by an imaging data set archive. Following prediction of motion artifact levels in the extracted data, the combined solution may then provide a comprehensive visualization of the results, possibly along with other quality metrics.

In another aspect, the invention relates to a magnetic resonance imaging system. The magnetic resonance imaging system comprises a magnetic resonance imaging data processing system as described above. The magnetic resonance imaging system further comprises a main magnet for generating a main magnetic field within an imaging zone, a magnetic field gradient system for generating a spatially dependent gradient magnetic field within the imaging zone, and a radio-frequency antenna system configured for acquiring magnetic resonance data from the imaging zone. The memory further stores pulse sequence commands. The pulse sequence commands are configured for controlling the magnetic resonance imaging system to acquire the magnetic resonance data from the imaging zone. The execution of the machine executable instructions further causes the processor to control the magnetic resonance imaging system in order to receive the magnetic resonance imaging data set to acquire magnetic resonance imaging data from the imaging zone by the radio-frequency antenna system. The received magnetic resonance imaging data set is provided using the acquired magnetic resonance imaging data.

Embodiments may have the beneficial effect that a direct evaluation of magnetic resonance imaging data sets during an ongoing magnetic resonance imaging session is enabled. The magnetic resonance imaging data set may e.g. comprise the magnetic resonance imaging data acquired using radio-frequency antenna system or e.g. be reconstructed from the magnetic resonance imaging data acquired using radio-frequency antenna system. For example, acquired magnetic resonance imaging data is selected which provides a two- or three-dimensional representation of an anatomic structure.

The motion artifact detection may be realized as a dedicated add-on to a magnetic resonance imaging system software. Thus, the magnetic resonance data may be analyzed directly after data acquisition, when the complex raw data is still available. This e.g. allows for automatic warnings that may be displayed to the user if a predefined threshold for a motion artifact level is exceeded. The user may then take appropriate measures such as performing a re-scan, increasing the number of signal averages (NSAs), giving instructions to the patient, etc.

According to embodiments, in case the assigned motion artifact level identifier exceeds a predefined threshold, the magnetic resonance imaging data acquisition is repeated and an additional magnetic resonance imaging data set is provided using the magnetic resonance imaging data of the repeated acquisition. Embodiments may have the beneficial effect that in case a magnetic resonance imaging data set comprises too many and/or to strong motion artifacts, the respective magnetic resonance imaging data set may be corrected by an additional data acquisition.

According to embodiments, an averaged magnetic resonance imaging data set is calculated using the magnetic resonance imaging data of the magnetic resonance imaging data set exceeding the predefined threshold and the magnetic resonance imaging data of the additional magnetic resonance imaging data set. The averaged magnetic resonance imaging data is used to provide the received magnetic resonance imaging data set. Embodiments may have the beneficial effect that the averaged magnetic resonance data may result in a reduction of the motion artifact level.

In another aspect, the invention relates to a computer program product comprising machine executable instructions for execution by a processor controlling a magnetic resonance imaging data processing system for processing motion artifacts in magnetic resonance imaging data sets using a trained deep learning network. The deep learning network is trained for the processing of motion artifacts in magnetic resonance imaging data sets. The magnetic resonance imaging data processing system further comprises a memory storing machine executable instructions and the trained deep learning network. An execution of the machine executable instructions causes the processor to control the magnetic resonance imaging data processing system to receive a magnetic resonance imaging data set and apply the received magnetic resonance imaging data set as an input to the trained deep learning network. Furthermore, the magnetic resonance imaging data processing system is controlled to process one or more motion artifacts present in the received magnetic resonance imaging data set using the trained deep learning network.

According to embodiments, the machine executable instructions further comprise pulse sequence commands. The pulse sequence commands are configured for controlling a magnetic resonance imaging system to acquire the magnetic resonance data from an imaging zone. The magnetic resonance imaging system comprises the magnetic resonance imaging data processing system. The magnetic resonance imaging system comprises a main magnet for generating a main magnetic field within the imaging zone, a magnetic field gradient system for generating a spatially dependent gradient magnetic field within the imaging zone, and a radio-frequency antenna system configured for acquiring magnetic resonance data from the imaging zone. The execution of the machine executable instructions further causes the processor to control the magnetic resonance imaging system in order to receive the magnetic resonance imaging data set to acquire magnetic resonance imaging data from the imaging zone by the radio-frequency antenna system. Furthermore, the received magnetic resonance imaging data set is provided using the acquired magnetic resonance imaging data.

In another aspect, the invention relates to a method of operating a magnetic resonance imaging data processing system for processing motion artifacts in magnetic resonance imaging data sets using a trained deep learning network. The deep learning network is trained for the processing of motion artifacts in magnetic resonance imaging data sets. The magnetic resonance imaging data processing system comprises a memory storing machine executable instructions and the trained deep learning network. The magnetic resonance imaging data processing system further comprises a processor for controlling the magnetic resonance imaging data processing system. The method comprises receiving a magnetic resonance imaging data set, apply the received magnetic resonance imaging data set as an input to the trained deep learning network, processing one or more motion artifacts present in the received magnetic resonance imaging data set using the trained deep learning network.

According to embodiments, wherein the magnetic resonance imaging data processing system is comprised by a magnetic resonance imaging system. The magnetic resonance imaging system further comprises a main magnet for generating a main magnetic field within an imaging zone, a magnetic field gradient system for generating a spatially dependent gradient magnetic field within the imaging zone, and a radio-frequency antenna system configured for acquiring magnetic resonance data from the imaging zone. The memory further stores pulse sequence commands. The pulse sequence commands are configured for controlling the magnetic resonance imaging system to acquire the magnetic resonance data from the imaging zone. The method further comprises acquiring magnetic resonance imaging data from the imaging zone by the radio-frequency antenna system and providing the received magnetic resonance imaging data set using the acquired magnetic resonance imaging data.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
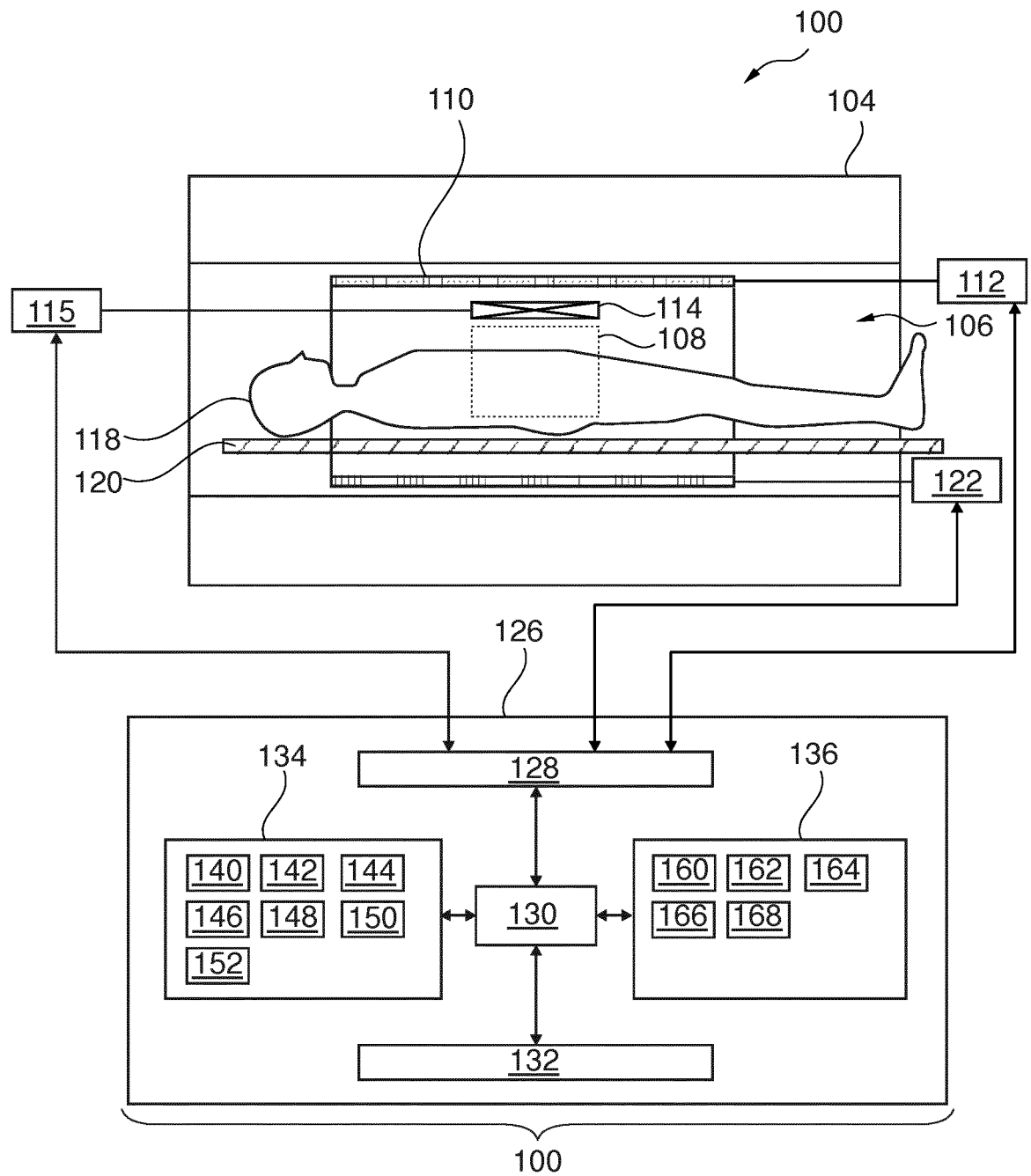
FIG. 1 illustrates an example of a magnetic resonance imaging system.

FIG. 1 shows an example of a magnetic resonance imaging system 100 with a magnet 104. The main magnet 104 is a superconducting cylindrical type magnet 104 with a bore 106 through it. The use of different types of magnets is also possible. For instance, it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 106 of the cylindrical magnet 104 there is an imaging zone 108 where the magnetic field is strong and uniform enough to perform magnetic resonance imaging.

Within the bore 106 of the magnet there is also a set of magnetic field gradient coils 110 forming a magnetic field gradient system which is used for acquisition of magnetic resonance data to spatially encode magnetic spins within the imaging zone 108 of the magnet 104. The magnetic field gradient coils 110 connected to a magnetic field gradient coil power supply 112. The magnetic field gradient coils 110 are intended to be representative. Typically, magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114, also referred to as radio-frequency antenna system, for manipulating the orientations of magnetic spins within the imaging zone 108 and for receiving radio transmissions from spins also within the imaging zone 108. The radio frequency coil 114 may contain multiple coil elements. The radio-frequency coil 114 is connected to a radio frequency transceiver 115. The radio-frequency coil 114 and radio frequency transceiver 115 may be replaced by separate transmit and receive coils and a separate transmitter and receiver. It is understood that the radio-frequency coil 114 and the radio frequency transceiver 115 are representative. The radio-frequency coil 114 is intended to also represent a dedicated transmit antenna and a dedicated receive antenna. Likewise, the transceiver 115 may also represent a separate transmitter and receivers. The radio-frequency coil 114 may also have multiple receive/transmit elements and the radio frequency transceiver 115 may have multiple receive/transmit channels.

The subject support 120 is attached to an optional actuator 122 that is able to move the subject support and the subject 118 through the imaging zone 108. In this way, a larger portion of the subject 118 or the entire subject 118 can be imaged. The transceiver 115, the magnetic field gradient coil power supply 112 and the actuator 122 are shown as being connected to a hardware interface 128 of computer system 126.

The computer 126 is further shown as containing a processor 130 which is operable for executing machine-readable instructions. The computer 126 is further shown as comprising a user interface 132, computer storage 134 and computer memory 136 which are all accessible and connected to the processor 130.

The computer storage 134 may contain one or more pulse sequences 140. The pulse sequences 140 are either instructions or data which can be converted into instructions which enable the processor 130 to acquire magnetic resonance data using the magnetic resonance imaging system 100.

The computer 126 may be configured as a magnetic resonance imaging data processing system. The computer storage 134 is further shown as containing magnetic resonance imaging data 142 acquired by radio-frequency coil 114. The computer storage 134 is further shown as containing magnetic resonance imaging data sets 144. The magnetic resonance imaging data sets 144 may e.g. comprise reconstructed magnetic resonance images. The computer storage 136 is further shown as containing a trained deep learning network 146. The trained deep learning network 146 may for example comprise a trained deep convolutional neural network and/or a trained fully convolutional network. In addition, the computer storage 136 comprises results 148 resulting from applying the magnetic resonance imaging data sets 144 to the trained deep learning network 146. According to alternative embodiments, the deep learning network 146 may be provided in form of an untrained deep learning network, which is trained by computer 126 in order to be able to process the magnetic resonance imaging data sets 144 and in particular motion artifacts comprised by the magnetic resonance imaging data sets 144.

The trained deep learning network 146, e.g. in form of a trained deep convolutional neural network, may be trained to detect a presence of motion artifacts in the magnetic resonance imaging data sets 144 and/or to determine a motion artifact level of each of the magnetic resonance imaging data sets 144. The motion artifact level identifiers identifying the determined motion artifact levels are each assigned to the magnetic resonance imaging data sets 144 for which they are determined. In this case, the results 148 for example comprise the motion artifact level identifiers which are assigned to the magnetic resonance imaging data sets 144.

The trained deep learning network 146, e.g. in form of a trained fully convolutional neural network, may be is trained as a filter of motion artifacts and/or to correct motion artifacts comprised by the magnetic resonance imaging data sets 144. Applying the magnetic resonance imaging data sets 144 to the trained deep learning network 146 may result in magnetic resonance imaging data sets with a reduced motion artifact level, i.e. motion-artifact-corrected magnetic resonance imaging data sets. In this case, the results 148 may comprise for example magnetic resonance imaging data sets with a reduced motion artifact level. Alternatively, applying the magnetic resonance imaging data sets 144 to trained deep learning network 146 may results in motion-artifact-only imaging data sets comprising only the imaging data set structures magnetic resonance imaging data sets 144 which are due to motion artifacts.

The computer storage 136 may further contain a training set 150. The training set 150 may comprise a plurality of magnetic resonance imaging training data sets with and without motion artifacts. Furthermore, the magnetic resonance imaging training data sets with motion artifacts may comprise different numbers/degrees of motion artifacts resulting in different motion artifacts levels for training the deep learning network 146. The training may start with an untrained or a pre-trained version of deep learning network 146. Each of the magnetic resonance imaging training data sets may be assigned with a motion artifact level and/or the training set 150 may comprises for each of the magnetic resonance imaging training data sets a magnetic resonance imaging reference data set assigned to the respective magnetic resonance imaging training data set. The magnetic resonance imaging reference data sets are each a motion-artifact-free version of the magnetic resonance imaging training data set to which they are assigned.

In addition, computer storage 136 is shown to comprise a set 152 of magnetic resonance imaging data sets without motion artifacts, i.e. motion-artifact-free magnetic resonance imaging data sets. These motion-artifact-free magnetic resonance imaging data sets may be used for generating the training set 150. Generating the training set 150 may comprise introducing varying numbers, degrees and/or types of artificially generated motion artifacts to one or more of the motion-artifact-free magnetic resonance imaging data sets of set 152.

The computer memory 136 is shown as comprising a control module 160. The control module 160 contains computer executable code or instructions which enable the processor 130 to control the operation and function of the magnetic resonance imaging system. For instance, the control module 160 may work in conjunction with the pulse sequences 140 to acquire the various magnetic resonance imaging data 142. The computer memory 138 is shown as further containing an imaging reconstruction module 162 which contains computer executable code or instructions which enable the processor 130 to control the operation and function of the magnetic resonance imaging system to reconstruct magnetic resonance images. For example, the magnetic resonance imaging data sets 144 may comprise magnetic resonance images reconstructed from the acquired magnetic resonance imaging data 142.

The computer memory 138 may further contain a motion artifacts processing module 164. The motion artifacts processing module 164 contains computer executable code or instructions which enable the processor 130 to apply the magnetic resonance imaging data sets 144 to the deep learning network 146 and to generate the results 148. The results 148 may for example comprise motion artifact level identifiers identifying determined motion artifact levels assigned to the magnetic resonance imaging data sets 144 and/or magnetic resonance imaging data sets with a reduced motion artifact level.

Furthermore, the computer memory 138 may comprise a training module 166 containing computer executable code or instructions which enable the processor 130 to train the deep learning network 146 with the set 150 of magnetic resonance imaging training data sets.

Finally, computer memory 138 may comprise a motion artifact simulation module 168 containing computer executable code or instructions. The computer executable code or instructions of the motion artifact simulation module 168 enable the processor 130 to the set 150 of magnetic resonance imaging training data sets by simulating and introducing varying numbers, degrees and/or types of artificially generated motion artifacts to one or more of the motion-artifact-free magnetic resonance imaging data sets of set 152.

Figure 2:
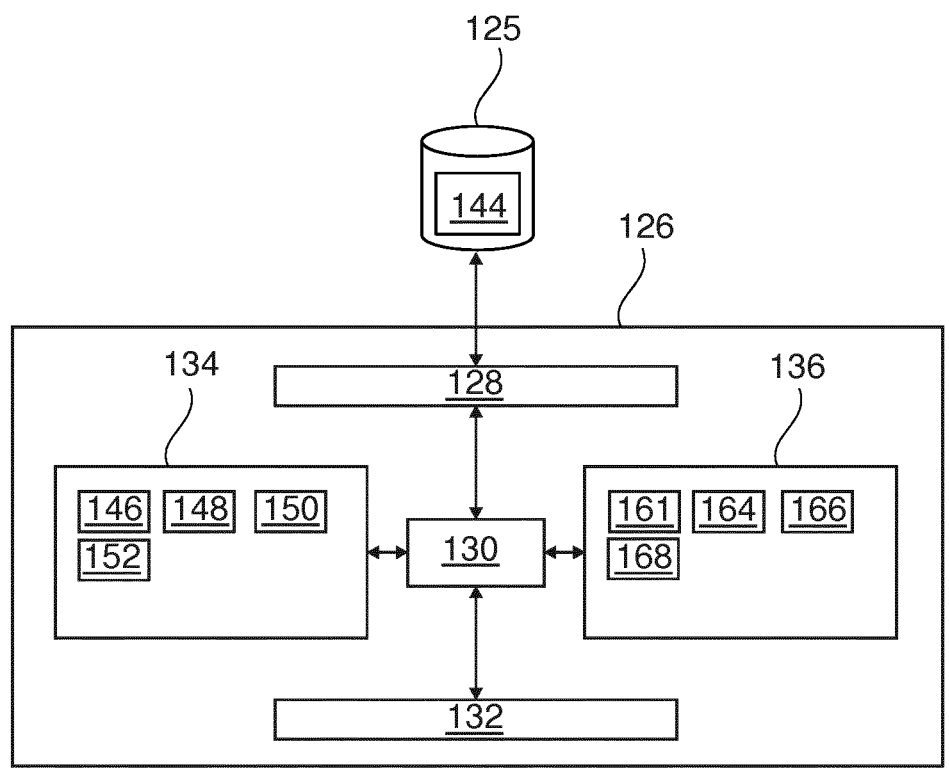
FIG. 2 illustrates an example of a magnetic resonance imaging data processing system.

FIG. 2 shows an example of a magnetic resonance imaging data processing system 126 provided by a computer system. The computer 126 is shown as containing a processor 130 which is operable for executing machine-readable instructions. The computer 126 is further shown as comprising a user interface 132, computer storage 134 and computer memory 136 which are all accessible and connected to the processor 130. Furthermore, the computer 126 may communicatively be connected with a database 125. The computer 126 may be configured to request data via the communication interface 128 from the database 125. According to embodiments, the database may be provided by an external system and accessible for the computer 126 via a communication network of a direct communication connection. The communication connection may be established wireless or via a wire. According to embodiments the database 125 may be comprised by the computer 126 itself. For example, the database 125 may be comprised by the computer storage 134. Furthermore, the may be provided by a computer-readable storage medium. The database 125 containing magnetic resonance imaging data sets 144. The magnetic resonance imaging data sets 144 may e.g. reconstructed magnetic resonance images.

The computer storage 136 is shown as containing a trained deep learning network 146. The trained deep learning network 146 may for example comprise a trained deep convolutional neural network and/or a trained fully convolutional network. In addition, the computer storage 136 comprises results 148 resulting from applying the magnetic resonance imaging data sets 144 to the trained deep learning network 146. According to alternative embodiments, the deep learning network 146 may be provided in form of an untrained deep learning network, which is trained by computer 126 in order to be able to process the magnetic resonance imaging data sets 144 and in particular motion artifacts comprised by the magnetic resonance imaging data sets 144.

The trained deep learning network 146, e.g. in form of a trained deep convolutional neural network, may be trained to detect a presence of motion artifacts in the magnetic resonance imaging data sets 144 and/or to determine a motion artifact level of each of the magnetic resonance imaging data sets 144. Motion artifact level identifiers identifying the motion artifact levels are each assigned to the magnetic resonance imaging data sets 144 for which they are determined. In this case, the results 148 for example comprise the motion artifact level identifiers which are assigned to the magnetic resonance imaging data sets 144.

The trained deep learning network 146, e.g. in form of a trained fully convolutional neural network, may be is trained as a filter of motion artifacts and/or to correct motion artifacts comprised by the magnetic resonance imaging data sets 144. Applying the magnetic resonance imaging data sets 144 to the trained deep learning network 146 may results in magnetic resonance imaging data sets with a reduced motion artifact level, i.e. motion-artifact-corrected magnetic resonance imaging data sets. In this case, the results 148 may comprise for example magnetic resonance imaging data sets with a reduced motion artifact level. Alternatively, applying the magnetic resonance imaging data sets 144 to trained deep learning network 146 may results in motion-artifact-only imaging data sets comprising only those imaging data set structures of magnetic resonance imaging data sets 144 which are due to motion artifacts.

The computer storage 136 may further contain a training set 150. The training set 150 may comprise a plurality of magnetic resonance imaging training data sets with and without motion artifacts. Furthermore, the magnetic resonance imaging training data sets with motion artifacts may comprise different numbers/degrees of motion artifacts resulting in different motion artifacts levels for training the deep learning network 146. The training may start with an untrained or a pre-trained version of deep learning network 146. Each of the magnetic resonance imaging training data sets may be assigned with a motion artifact level identifier and/or the training set 150 may comprises for each of the magnetic resonance imaging training data sets a magnetic resonance imaging reference data set assigned to the respective magnetic resonance imaging training data set. The magnetic resonance imaging reference data sets are each a motion-artifact-free version of the magnetic resonance imaging training data set to which they are assigned.

In addition, computer storage 136 is shown to comprise a set 152 of magnetic resonance imaging data sets without motion artifacts, i.e. motion-artifact-free magnetic resonance imaging data sets. These motion-artifact-free magnetic resonance imaging data sets may be used for generating the training set 150. Generating the training set 150 may comprise introducing varying numbers, degrees and/or types of artificially generated motion artifacts to one or more of the motion-artifact-free magnetic resonance imaging data sets of set 152.

The computer memory 136 is shown as comprising a control module 161. The control module 161 contains computer executable code or instructions which enable the processor 130 to control the operation and function of the magnetic resonance imaging data processing system and e.g. receive one or more of the magnetic resonance imaging data sets 144 for processing.

The computer memory 138 may further contain a motion artifacts processing module 164. The motion artifacts processing module 164 contains computer executable code or instructions which enable the processor 130 to apply the magnetic resonance imaging data sets 144 to the deep learning network 146 and to generate the results 148. The results 148 may for example comprise motion artifact level identifier identifying the determined motion artifact levels assigned to the magnetic resonance imaging data sets 144 and/or magnetic resonance imaging data sets with a reduced motion artifact level.

Furthermore, the computer memory 138 may comprise a training module 166 containing computer executable code or instructions which enable the processor 130 to train the deep learning network 146 with the set 150 of magnetic resonance imaging training data sets.

Finally, computer memory 138 may comprise a motion artifact simulation module 168 containing computer executable code or instructions. The computer executable code or instructions of the motion artifact simulation module 168 enable the processor 130 to the set 150 of magnetic resonance imaging training data sets by simulating and introducing varying numbers, degrees and/or types of artificially generated motion artifacts to one or more of the motion-artifact-free magnetic resonance imaging data sets of set 152.

Figure 3:
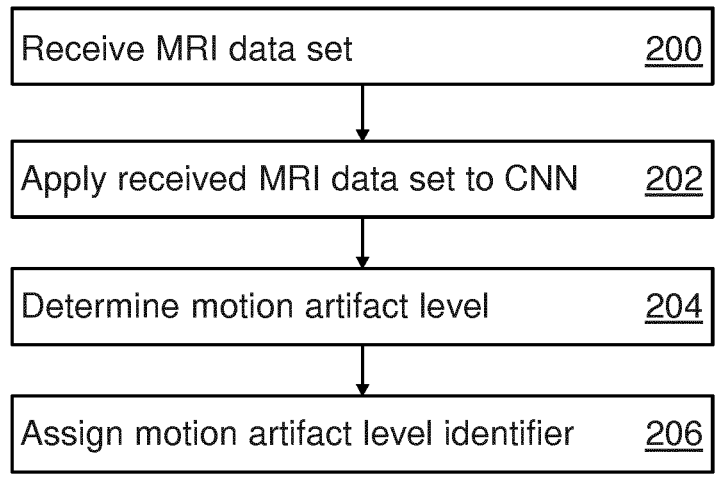
FIG. 3 illustrates an example of a method of operating a magnetic resonance imaging data processing system.

FIG. 3 shows a schematic flowchart which illustrates a method of operating the magnetic resonance imaging system 100 with the magnetic resonance imaging data processing system 126 shown in FIG. 1 or the magnetic resonance imaging data processing system 126 in FIG. 2. In step 200, a magnetic resonance imaging data set is received, which either may be provided using magnetic resonance imaging data acquired with the magnetic resonance imaging system 100 in case of FIG. 1 or which may be received from a computer storage medium, like e.g. a database, in case of the magnetic resonance imaging data processing system 126 in FIG. 2. In step 202, the received magnetic resonance imaging data set may be applied to a trained deep learning network, like e.g. a deep convolutional neural network (CNN). The deep convolutional neural network may be trained for determining motion artifact levels of magnetic resonance imaging data sets. In step 204, a motion artifact level is determined by the deep convolutional neural network based on the artifacts detected in the received magnetic resonance imaging data set. In step 206, a motion artifact level identifier, which may be received as an output from the deep convolutional neural network is assigned to the received magnetic resonance imaging data set. The motion artifact level identifier identifies the result of the motion artifact level determination, i.e. the evaluated artifact level.

Figure 4:
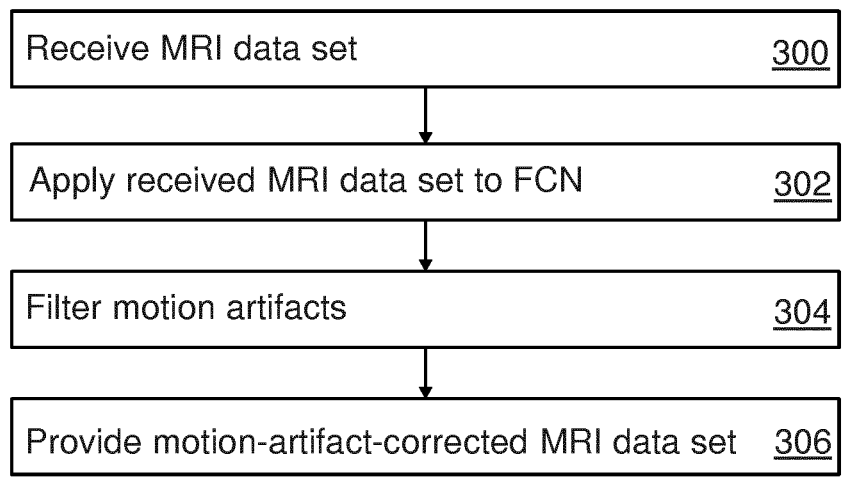
FIG. 4 illustrates an example of a method of operating a magnetic resonance imaging data processing system.

FIG. 4 shows a schematic flowchart which illustrates a further method of operating the magnetic resonance imaging system 100 with the magnetic resonance imaging data processing system 126 shown in FIG. 1 or the magnetic resonance imaging data processing system 126 in FIG. 2. In step 300, a magnetic resonance imaging data set is received, which either may be provided using magnetic resonance imaging data acquired with the magnetic resonance imaging system 100 in case of FIG. 1 or may be received from a computer storage medium, like e.g. a database, in case of the magnetic resonance imaging data processing system 126 in FIG. 2. In step 302, the received magnetic resonance imaging data set may be applied to a trained deep learning network, like e.g. a fully convolutional neural network (FCN). The fully convolutional neural network may be trained for filtering motion artifacts present in magnetic resonance imaging data sets. In step 304, motion artifacts present in the received magnetic resonance imaging data set may be filtered. The result of the filtering may either be a motion-artifact-corrected magnetic resonance imaging data set or a motion-artifact-only magnetic resonance imaging data set. In the 306, the motion-artifact-corrected magnetic resonance imaging data set is provided. For example, the motion-artifact-corrected magnetic resonance imaging data set is provided form of a motion-artifact-corrected MRI image. In case the result of the filtering is the motion-artifact-corrected magnetic resonance imaging data set, the motion-artifact-corrected magnetic resonance imaging data set is provided by the output of the fully convolutional neural network. In case the result of the filtering is a motion-artifact-only magnetic resonance imaging data set, the motion-artifact-corrected magnetic resonance imaging data set may be provided by subtraction the output of the fully convolutional neural network, i.e. the motion-artifact-only magnetic resonance imaging data set, from the received magnetic resonance imaging data set. The motion-artifact-only magnetic resonance imaging data set has a reduced motion artifact level compared to the received magnetic resonance imaging data set.

Figure 5:
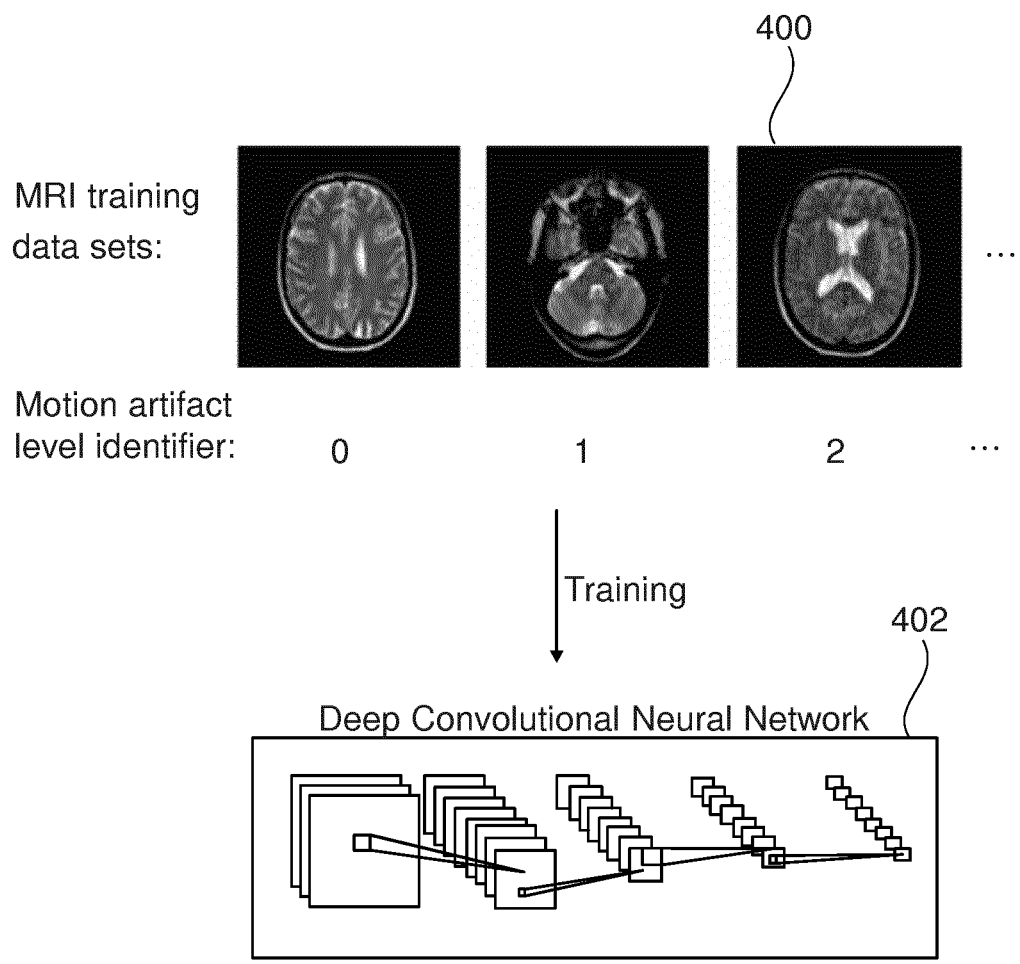
FIG. 5 illustrates an example of a method of training a deep learning network for motion artifact level determination.

FIG. 5 shows a schematic flowchart which illustrates a method for training a deep convolutional network 402, like e.g. a deep convolutional neural network. Training refers to an optimization of the weights and biases of the neurons comprised by the deep convolutional neural network to achieve the desired capabilities for detecting the presence of motion artifacts in magnetic resonance imaging data sets and/or determining a motion artifact level. The training may comprise providing a large training set 400 of clinical magnetic resonance imaging data sets with and without motion artifacts. Each of the clinical magnetic resonance imaging data sets is labeled with a motion artifact level identifier identifying the artifact level of the respective imaging data set. FIG. 5 illustrates an exemplary definition of the motion artifact levels by a single integer number in the range from 0 to 2, which may represent imaging data sets with no (0), mild (1) or severe motion artifacts (2), respectively. In a training phase, the clinical magnetic resonance imaging data sets of training set 400 are applied as input to an untrained deep learning network, like e.g. a deep convolutional neural network. The deep convolutional neural network returns motion artifact level identifier as output which may be compared with the motion artifact levels identifier assigned to the clinical magnetic resonance imaging data sets applied as input. This may be performed for batches comprising a plurality of the clinical magnetic resonance imaging data sets and the differences may be statistically evaluated. Based on these evaluation parameters of the deep convolutional neural network may be adjusted until the output provided by the deep convolutional neural network, when applying the imaging training data sets to the same, correspond to the motion artifact level identifier assigned to the imaging training data sets. The training results in a trained deep convolutional neural network 402 which may be used for determining motion artifact level, like e.g. shown in FIG. 6.

Figure 6:
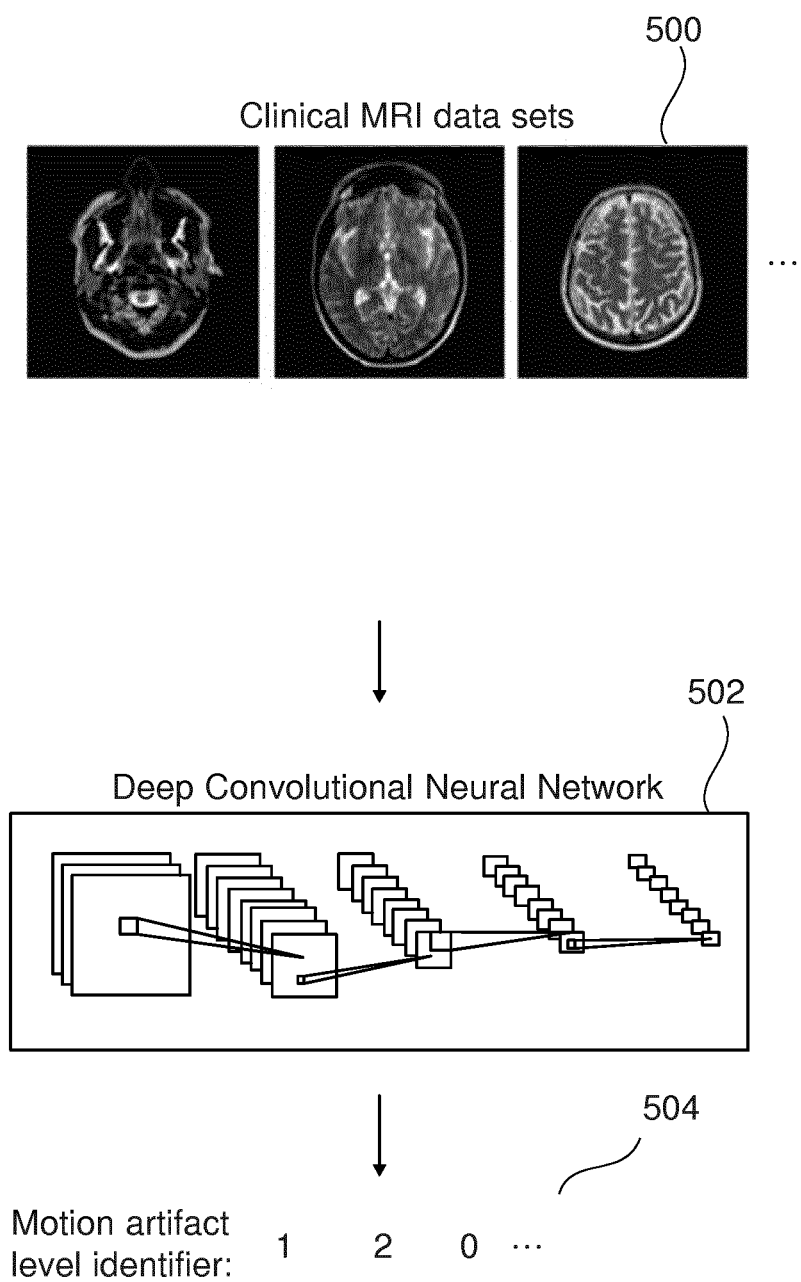
FIG. 6 illustrates an example of a method of motion artifact level determination using a trained a deep learning network.

FIG. 6 shows a schematic flowchart which illustrates a method corresponding to the method shown in FIG. 3. Clinical magnetic resonance imaging data sets 500 are provided. The clinical magnetic resonance imaging data sets are applied to a trained deep convolutional neural network 502, which may have been trained according to FIG. 5. As a result, motion artifact level identifier 504 may be received as an output from the trained deep convolutional neural network 502 and assigned to the clinical magnetic resonance imaging data sets.

Figure 7:
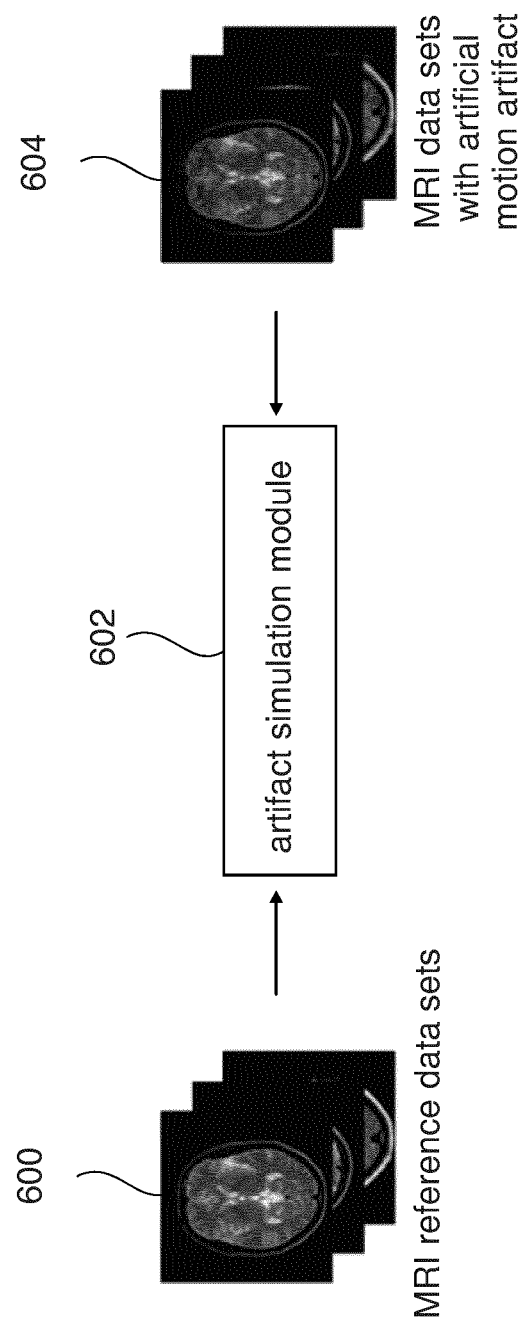
FIG. 7 illustrates an example of a method of generating MRI data sets with artificial motion artifacts.

FIG. 7 shows a schematic flowchart which illustrates a method for generating magnetic resonance imaging training data sets with motion artifacts. A set of motion-artifact-free magnetic resonance imaging data sets 600 is provided. The motion-artifact-free magnetic resonance imaging data sets may furthermore be used as magnetic resonance imaging reference data sets, e.g. for training a fully convolutional neural network for filtering motion artifacts present in magnetic resonance imaging data sets. The motion-artifact-free magnetic resonance imaging data sets 600 are applied to a motion artifact simulation module 602 generating artificial motion artifacts. By introducing the artificial motion artifacts to motion-artifact-free magnetic resonance imaging data sets 600 magnetic resonance imaging data set 604 with one or more motion artifacts are generated. The magnetic resonance imaging data set 604 may each be paired with the motion-artifact-free magnetic resonance imaging data set 600 used to generated the respective magnetic resonance imaging data set 604. The magnetic resonance imaging data set 604 may each be assigned with a motion artifact level identifier identifying the motion artifact level of the respective magnetic resonance imaging data set due to the one or more motion artifacts introduced by the motion artifact simulation module 602.

Figure 8:
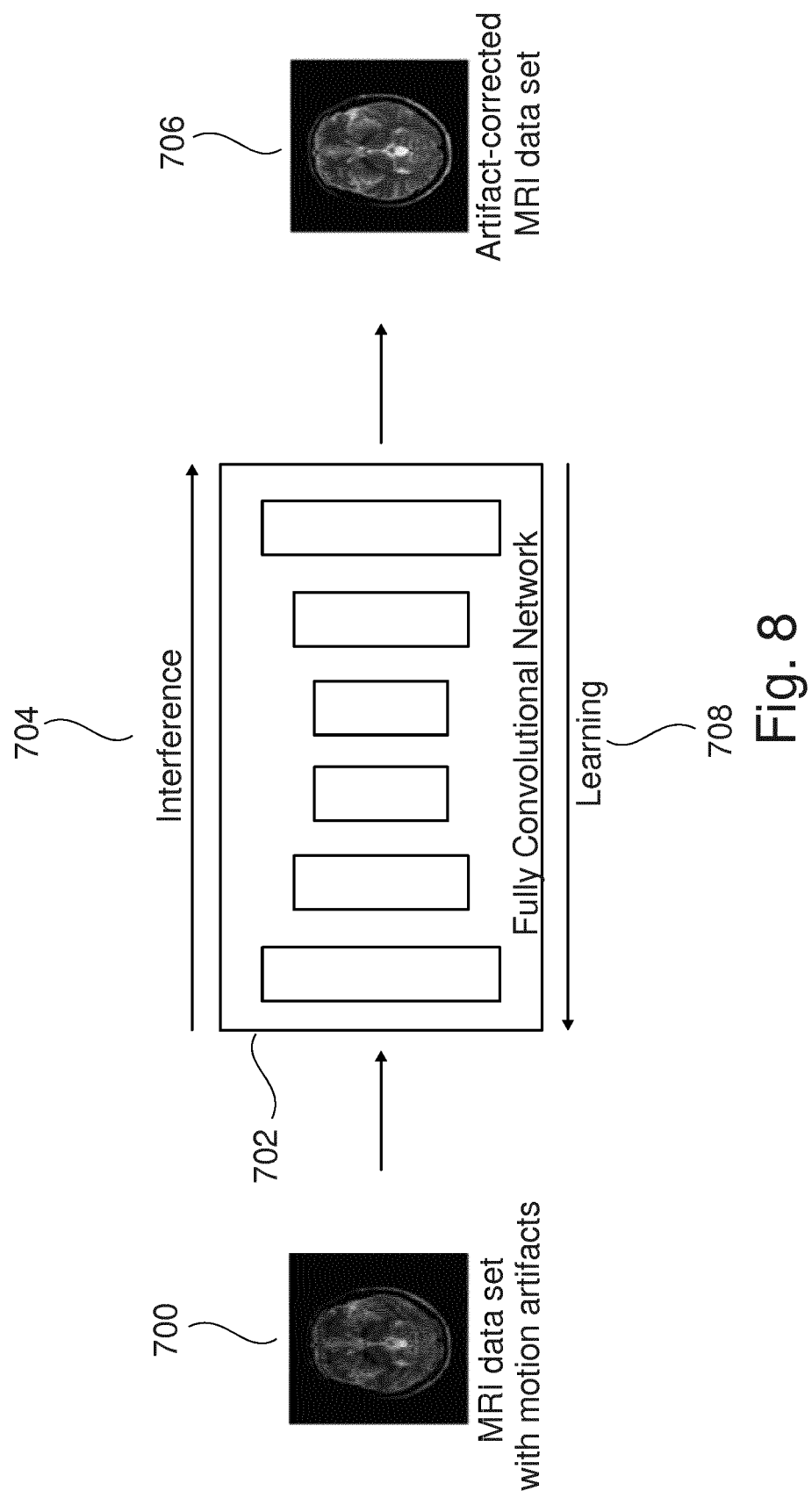
FIG. 8 illustrates an example of a method of training a deep learning network for motion artifact correction.

FIG. 8 shows a schematic flowchart which illustrates a method for training a fully convolutional neural network 702. During an iterative process, the network parameters of the fully convolutional neural network 702 may be optimized. In an inference step 704 a prediction of a motion-artifact-corrected imaging data set 706 may be performed by the fully convolutional neural network 702 using a magnetic resonance imaging data sets with motion artifacts 700. The resulting difference between a motion-artifact-free imaging reference data set and the output of the fully convolutional neural network 702 is propagated back through the respective fully convolutional neural network 702 during a learning phase 708. This procedure may for example be performed by applying batches of resonance imaging data sets with motion artifacts 700 to the fully convolutional neural network 702 and statistically evaluating the differences between the input batch and a resulting output batch comprising a plurality of predictions of motion-artifact-corrected imaging data sets 706. After a successful training, the fully convolutional neural network 702 may be applied to actual motion-artifact-corrupted magnetic resonance imaging data sets and may provide magnetic resonance imaging data sets with reduced artifact level as a result according to the method of FIG. 4.

Figure 9:
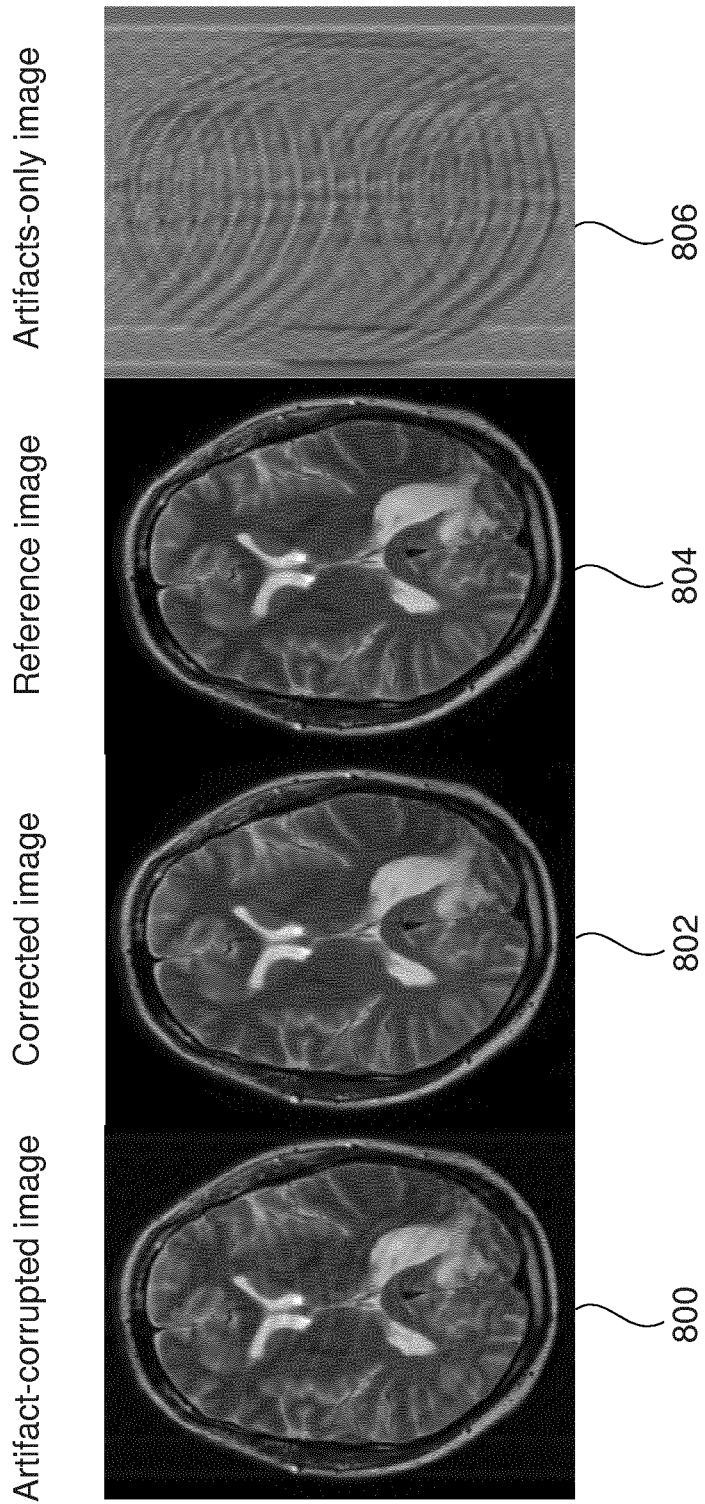
FIG. 9 illustrates an example of MRI images used for motion artifact correction.

FIG. 9 shows an exemplary magnetic resonance reference image 804 without motion artifacts. Reference image 804 is provided by a magnetic resonance imaging reference data set representing an exemplary slice through a set of magnetic resonance imaging data. In addition, an exemplary magnetic resonance image 800 is shown which comprises artificial motion artifacts and may be applied to a deep learning network, e.g. a fully convolutional neural network as input. Reference image 804 is provided in order to illustrate the effectiveness of the processing of the motion artifacts present in the magnetic resonance image 802 using the fully convolutional neural network. Furthermore, a motion-artifact-corrected magnetic resonance image 802 is shown. Motion-artifact-corrected magnetic resonance image 802 results from a correction of motion-artifact-corrupted magnetic resonance images 800. The motion-artifact-corrected magnetic resonance image 802 may be provided as a direct output by the fully convolutional neural network. Alternatively, the fully convolutional neural network may return motion-artifact-only magnetic resonance images. An example of such a motion-artifact-only magnetic resonance image is illustrated by image 806. In case, the fully convolutional neural network returns motion-artifact-only magnetic resonance image 806 as an output, the motion-artifact-corrected magnetic resonance image 802 may be generated by subtracting motion-artifact-only magnetic resonance images 806 from the original magnetic resonance images 800 with artifacts.

The generation and usage of the images 800 to 806 may be further illustrated in the following. For example, reference image 804 is acquired based on T2-weighted whole-brain patient scans with multi-2D spin echo sequence and magnitude data only. The reference images 804 may be reconstructed from acquired magnetic resonance imaging data rated as motion-artifact-free. Artifacts due to bulk translational motion may be simulated for reference image 804 by an additional phase that is applied to the Fourier transformed data:

$$S(\vec{k})=S(\vec{k})e^{i2\pi \vec{k}\cdot \vec{T}},$$

where T defines the motion trajectory. Three different translational trajectories, i.e. sudden, oscillating, and continuous motion, may be simulated with varying motion amplitudes in the range of e.g. 2 to 12 pixels. Furthermore, artifacts due to bulk rotational motion may be simulated for reference image 804 by replacing parts of the Fourier transformed input image by the Fourier transform of a rotated version of the input image. Two different rotational trajectories, i.e. sudden and oscillating motion, may be simulated with varying motion amplitudes e.g. in the range of 1.0° to 2.5°.

To increase the anatomic variability furthermore, random deformation, may be applied to the reference image 804. Motion-artifact-only image 806 may be returned by the fully convolutional network. In total, a training dataset comprising image pairs in the order of 100,000, each comprising a motion-artifact-corrupted image 800 and a reference image 804, may be generated using unique patient whole-brain scans of the order of 10. Using two additional T2-weighted whole-brain scans, a training or trusting set consisting of 100 images was generated in the same way.

The fully convolutional neural network may for example be implemented relying on a multi-resolution approach, i.e. two down-sampled variants of the input image are used as additional inputs to the fully convolutional network. Each resolution level may consist of two convolutional layers, each followed by a batch normalization layer and a rectifier linear unit. The different levels may be combined using average-un-pooling layers and shortcut connections. The fully convolutional neural network may be trained to minimize the mean square error between predicted motion artifacts and simulated motion artifacts. Training may e.g. be carried out during 32 epochs using the Adam optimization method and a mini-batch size of 32.

Afterwards, the trained fully convolutional neural network may be applied to a testing dataset. The testing dataset may correspond to the training datasets. Motion-artifact-corrupted images 800 may be applied to the trained fully convolutional neural network and estimates of the artifacts, i.e. motion-artifact-only images 806, may be returned as an output. The motion-artifact-only images 806 may be subtracted from the motion-artifact-corrupted input image 800, resulting in the motion-artifact-corrected magnetic resonance image 802. The resulting motion-artifact-corrected magnetic resonance image 802 may be compared with the magnetic resonance reference images 804.

Figure 10:
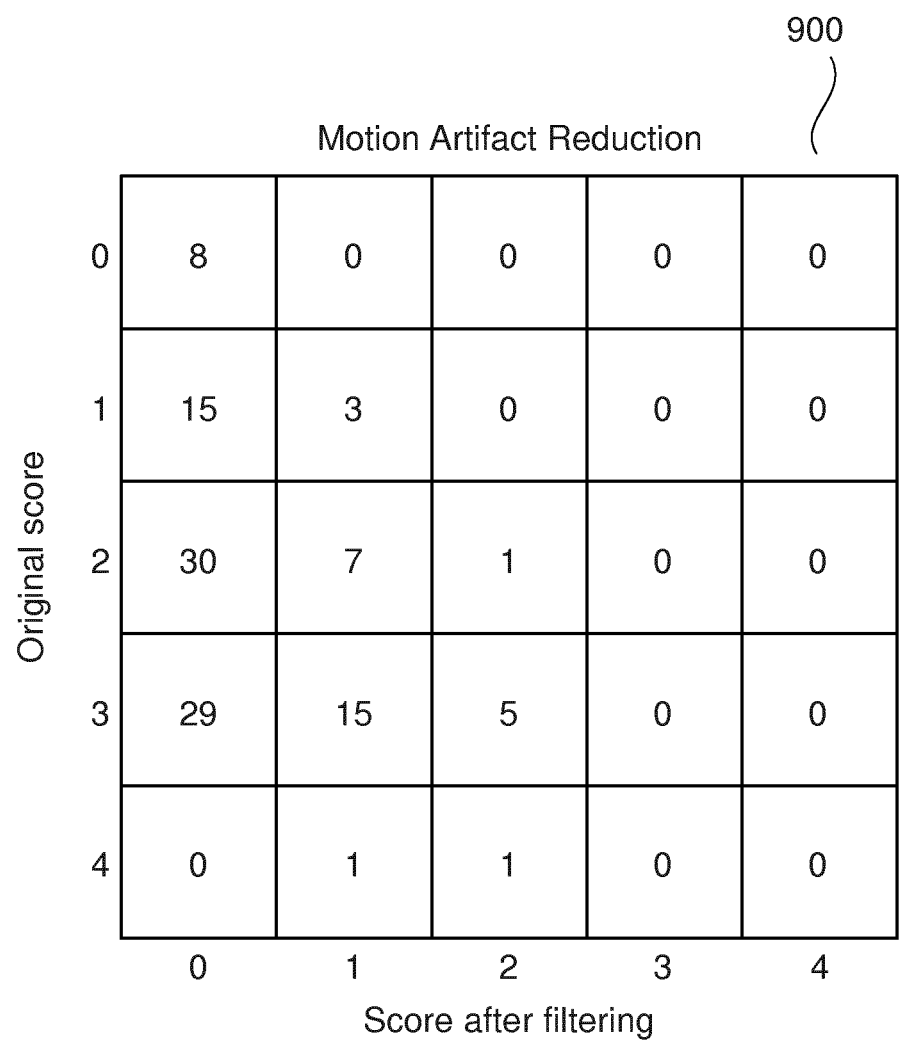
FIG. 10 illustrates results of motion artifact correction.

FIG. 10 illustrates the results of the aforementioned filtering given in terms of a confusion matrix 900. Confusion matrix 900 illustrates the success of the motion artifact reduction by comparing the numbers of motion-artifact-corrupted images 800 per class 0 to 4 before applying the same to the trained fully convolutional neural network with the numbers motion-artifact-corrected magnetic resonance image 802 per class 0 to 4 after application to the trained fully convolutional neural network. The artifacts may e.g. be classified using a five-point Likert scale. The comparison shows, that on average an improvement of 1.8 point has been achieved, while no additional quality degeneration is observable. For the majority of the slices, the application of the filter provided by the fully convolutional neural network resulted in a considerable reduction of the perceived severity, with an average improvement of around 1.8 points.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS

100 magnetic resonance imaging system
104 main magnet
106 bore of magnet
108 imaging zone
110 magnetic field gradient coil
112 magnetic field gradient coil power supply
114 radio-frequency coil
115 transceiver
118 subject
120 subject support
122 actuator
126 computer/MRI data processing system
128 hardware interface
130 processor
132 user interface
134 computer storage
136 computer memory
140 pulse sequences
142 acquired magnetic resonance imaging data 144 magnetic resonance imaging data sets
146 deep learning network
148 results
150 set of MRI training data sets
152 set of motion artifact-free MRI data sets
160 control module
161 control module
162 imaging reconstruction module
164 motion artifacts processing module
166 training module
168 motion artifact simulation module
400 MRI training data sets
402 deep convolutional neural network
500 clinical MRI data sets
502 trained deep convolutional neural network
504 motion artifact level identifier
600 MRI reference data sets
602 artifact simulation module
604 MRI data sets with artificial motion artifacts
700 MRI data set with motion artifacts
702 fully convolutional neural network
704 inference phase
706 motion-artifact-corrected MRI data set
708 learning phase
800 motion-artifact-corrupted input image
802 motion-artifact-corrected image
804 reference image
806 motion-artifacts-only image
900 confusion matrix

The invention claimed is:

1. A magnetic resonance imaging data processing system for processing motion artifacts in magnetic resonance imaging data sets using a deep learning network trained for the processing of motion artifacts in magnetic resonance imaging data sets, the magnetic resonance imaging data processing system comprising:
   a memory storing machine executable instructions and the trained deep learning network,
   a processor for controlling the magnetic resonance imaging data processing system, wherein an execution of the machine executable instructions causes the processor to control the magnetic resonance imaging data processing system to:
   receive a magnetic resonance imaging data set,
   apply the received magnetic resonance imaging data set as an input to the trained deep learning network, and
   process one or more motion artifacts present in the received magnetic resonance imaging data set using the trained deep learning network,
   wherein the deep learning network is further trained for filtering motion artifacts present in magnetic resonance imaging data sets, wherein the processing further comprises:
   filtering the one or more motion artifacts present in the magnetic resonance imaging data set using the trained deep learning network; and
   providing a motion-artifact-corrected magnetic resonance imaging data set using a result of the filtering;
   wherein the deep learning network is further trained for detecting the presence of motion artifacts in magnetic resonance imaging data sets, wherein the processing comprises detecting the presence of the one or more motion artifacts in the received magnetic resonance imaging data set, and wherein the execution of the machine executable instructions further causes the processor to control the magnetic resonance imaging data processing system to:
   indicate the presence of the one or more motion artifacts in the received magnetic resonance imaging data set;
   wherein the deep learning network is further trained for determining a motion artifact level of magnetic resonance imaging data sets, the motion artifact level characterizing the number and/or degree of motion artifacts present in the respective magnetic resonance imaging data set,
   wherein the processing further comprises:
   determining the motion artifact level of the received magnetic resonance imaging data set based on the one or more motion artifacts detected to be present in the received magnetic resonance imaging data set using the trained deep learning network,
   providing the motion artifact level as output from the trained deep learning network,
   wherein the indicating comprises assigning a motion artifact level identifier to the received magnetic resonance imaging data set identifying the determined motion artifact level.

2. The magnetic resonance imaging data processing system of claim 1, wherein the deep learning network is a deep convolutional neural network implementing deep learning.

3. The magnetic resonance imaging data processing system of claim 1, wherein the deep learning network is a fully convolutional network implementing deep learning.

4. The magnetic resonance imaging data processing system of claim 1, wherein the execution of the machine executable instructions further causes the processor to control the magnetic resonance imaging data processing system to train the deep learning network, wherein the training comprises:
   providing a training set comprising a plurality of magnetic resonance imaging training data sets with and without motion artifacts.

5. The magnetic resonance imaging data processing system of claim 4, wherein the providing of the training set comprises:
   generating the magnetic resonance imaging training data sets with motion artifacts, wherein the generating of the magnetic resonance imaging training data sets comprises introducing varying numbers, degrees and/or types of artificially generated motion artifacts to magnetic resonance imaging data sets without motion artifacts.

6. The magnetic resonance imaging data processing system of claim 4, wherein each of the magnetic resonance imaging training data sets is assigned with a motion artifact level identifier, wherein the training comprises training the deep learning network for determining motion artifact levels of magnetic resonance imaging data sets comprising:
   applying the magnetic resonance imaging training data sets as input to the deep learning network,
   determining for each of the magnetic resonance imaging training data sets a motion artifact level of the respective magnetic resonance imaging training data set using the trained deep learning network,
   providing the motion artifact levels of the magnetic resonance imaging training data sets as output from the deep learning network,
   comparing the output of the deep learning network with the motion artifact levels identified by the motion artifact level identifiers assigned to the input to the deep learning network,
   adapting network parameters of the deep learning network in order to reduce differences between the output of the deep learning network and the motion artifact levels identified by the motion artifact level identifiers assigned to the input to the deep learning network.

7. The magnetic resonance imaging data processing system of claim 4, wherein the training set further comprises for each of the magnetic resonance imaging training data sets a magnetic resonance imaging reference data set assigned to the respective magnetic resonance imaging training data set, wherein the magnetic resonance imaging reference data set is a motion-artifact-free version of the magnetic resonance imaging training data set to which it is assigned, wherein the training comprises training the deep learning network for filtering motion artifacts present in magnetic resonance imaging data sets comprising:
  applying the magnetic resonance imaging training data sets as input to the deep learning network,
  filtering motion artifacts of the magnetic resonance imaging training data sets using the trained deep learning network,
  providing for each of the magnetic resonance imaging training data sets a motion-artifact-corrected magnetic resonance imaging data set using a result of the filtering,
  comparing the motion-artifact-corrected magnetic resonance imaging data sets with the magnetic resonance imaging reference data sets,
  adapting network parameters of the deep learning network in order to reduce differences between motion-artifact-corrected magnetic resonance imaging data sets and the magnetic resonance imaging reference data sets.

8. The magnetic resonance imaging data processing system of claim 7, wherein the result of the filtering comprises the motion-artifact-corrected magnetic resonance imaging data sets which are provided as output from the deep learning network or
  wherein the result of the filtering comprises motion-artifact-only magnetic resonance imaging data sets provided as output from the deep learning network and wherein the providing of the motion-artifact-corrected magnetic resonance imaging data sets comprises subtracting the motion-artifact-only magnetic resonance imaging data sets from the magnetic resonance imaging training data sets.

9. A magnetic resonance imaging system comprising the magnetic resonance imaging data processing system of claim 1, wherein the magnetic resonance imaging system further comprises:
  a main magnet for generating a main magnetic field within an imaging zone,
  a magnetic field gradient system for generating a spatially dependent gradient magnetic field within the imaging zone,
  a radio-frequency antenna system configured for acquiring magnetic resonance imaging data from the imaging zone,
  wherein the memory further stores pulse sequence commands, wherein the pulse sequence commands are configured for controlling the magnetic resonance imaging system to acquire the magnetic resonance imaging data from the imaging zone,
  wherein the execution of the machine executable instructions further causes the processor to control the magnetic resonance imaging system in order to receive the magnetic resonance imaging data set to:
  acquire magnetic resonance imaging data from the imaging zone by the radio-frequency antenna system,
  provide the received magnetic resonance imaging data set using the acquired magnetic resonance imaging data.

10. A computer program product comprising machine executable instructions for execution by a processor controlling a magnetic resonance imaging data processing system for processing motion artifacts in magnetic resonance imaging data sets using a deep learning network trained for the processing of motion artifacts in magnetic resonance imaging data sets, the magnetic resonance imaging data processing system further comprising:
  a memory storing machine executable instructions and the trained deep learning network,
  wherein an execution of the machine executable instructions causes the processor to control the magnetic resonance imaging data processing system to:
  receive a magnetic resonance imaging data set,
  filter one or more motion artifacts present in the magnetic resonance imaging data set using the trained deep learning network by applying the received magnetic resonance imaging data set as an input to the trained deep learning network and processing the one or more motion artifacts present in the received magnetic resonance imaging data set using the trained deep learning network wherein a result of the filtering is a motion corrected magnetic resonance imaging dataset, wherein the deep learning network is trained for filtering motion artifacts present in magnetic resonance imaging data sets; and
  providing the motion-artifact-corrected magnetic resonance imaging data set as the result of the filtering.

11. A method of operating a magnetic resonance imaging data processing system for processing motion artifacts in magnetic resonance imaging data sets using a deep learning network trained for the processing of motion artifacts in magnetic resonance imaging data sets, the magnetic resonance imaging data processing system comprising:
  a memory storing machine executable instructions and the trained deep learning network,
  a processor for controlling the magnetic resonance imaging data processing system, wherein the method comprises:
  receiving a magnetic resonance imaging data set,
  filtering one or more motion artifacts present in the magnetic resonance imaging data set using the trained deep learning network by applying the received magnetic resonance imaging data set as an input to the trained deep learning network,
  processing one or more motion artifacts present in the received magnetic resonance imaging data set using the trained deep learning network, wherein a result of the filtering is a motion corrected magnetic resonance imaging dataset,
  wherein the deep learning network is trained for filtering motion artifacts present in magnetic resonance imaging data sets, and
  providing the motion-artifact-corrected magnetic resonance imaging data set using a result of the filtering.

12. The magnetic resonance imaging data processing system of claim 1, wherein the result of the filtering comprises the motion-artifact-corrected magnetic resonance imaging data set which is provided as output from the deep learning network or
  wherein the result of the filtering comprises a motion-artifact-only magnetic resonance imaging data set provided as output from the deep learning network and wherein the providing of the motion-artifact-corrected magnetic resonance imaging data set comprises subtracting the motion-artifact-only magnetic resonance imaging data set from the received magnetic resonance imaging data set.

13. The magnetic resonance imaging data processing system of claim 1 wherein the training of the deep learning network relies on MRI training data sets containing artificially simulated motion artifacts, and wherein the trained deep learning network is applied to actual clinical data for detection of motion artifacts.

14. The computer program product of claim 10 wherein the execution of the machine executable instructions further causes the processor to control the magnetic resonance imaging data processing system to train the deep learning network, wherein the training comprises:
providing a training set comprising a plurality of magnetic resonance imaging training data sets with and without motion artifacts;
wherein each of the magnetic resonance imaging training data sets is assigned with a motion artifact level identifier, wherein the training comprises training the deep learning network for determining motion artifact levels of magnetic resonance imaging data sets comprising:
applying the magnetic resonance imaging training data sets as input to the deep learning network,
determining for each of the magnetic resonance imaging training data sets a motion artifact level of the respective magnetic resonance imaging training data set using the trained deep learning network,
providing the motion artifact levels of the magnetic resonance imaging training data sets as output from the deep learning network,
comparing the output of the deep learning network with the motion artifact levels identified by the motion artifact level identifiers assigned to the input to the deep learning network,
adapting network parameters of the deep learning network in order to reduce differences between the output of the deep learning network and the motion artifact levels identified by the motion artifact level identifiers assigned to the input to the deep learning network.

15. The method of claim 11 wherein the execution of the machine executable instructions further causes the processor to control the magnetic resonance imaging data processing system to train the deep learning network, wherein the training comprises:
providing a training set comprising a plurality of magnetic resonance imaging training data sets with and without motion artifacts;
wherein the training set further comprises for each of the magnetic resonance imaging training data sets a magnetic resonance imaging reference data set assigned to the respective magnetic resonance imaging training data set, wherein the magnetic resonance imaging reference data set is a motion-artifact-free version of the magnetic resonance imaging training data set to which it is assigned, wherein the training comprises training the deep learning network for filtering motion artifacts present in magnetic resonance imaging data sets comprising:
applying the magnetic resonance imaging training data sets as input to the deep learning network,
filtering motion artifacts of the magnetic resonance imaging training data sets using the trained deep learning network,
providing for each of the magnetic resonance imaging training data sets a motion-artifact-corrected magnetic resonance imaging data set using a result of the filtering,
comparing the motion-artifact-corrected magnetic resonance imaging data sets with the magnetic resonance imaging reference data sets,
adapting network parameters of the deep learning network in order to reduce differences between motion-artifact-corrected magnetic resonance imaging data sets and the magnetic resonance imaging reference data sets.

* * * * *